US009608659B2

(12) United States Patent
Tanizawa

(10) Patent No.: US 9,608,659 B2
(45) Date of Patent: Mar. 28, 2017

(54) ANALOG/DIGITAL CONVERSION CIRCUIT

(71) Applicant: DENSO CORPORATION, Kariya, Aichi-pref. (JP)

(72) Inventor: Yukihiko Tanizawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/117,246

(22) PCT Filed: May 18, 2015

(86) PCT No.: PCT/JP2015/002487
§ 371 (c)(1),
(2) Date: Aug. 8, 2016

(87) PCT Pub. No.: WO2015/178008
PCT Pub. Date: Nov. 26, 2015

(65) Prior Publication Data
US 2016/0352350 A1    Dec. 1, 2016

(30) Foreign Application Priority Data

May 19, 2014 (JP) ................................. 2014-103283
Apr. 15, 2015 (JP) ................................. 2015-083317

(51) Int. Cl.
*H03M 1/38* (2006.01)
*H03M 1/12* (2006.01)

(52) U.S. Cl.
CPC ........... *H03M 1/38* (2013.01); *H03M 1/1205* (2013.01)

(58) Field of Classification Search
CPC .............................. H03M 1/38; H03M 1/1205
(Continued)

(56) References Cited

U.S. PATENT DOCUMENTS 7,030,803 B2 * 4/2006 Harada ................... H03M 1/64
341/155
7,612,699 B2 * 11/2009 Tanizawa ............ H03M 1/0678
341/155
(Continued)

FOREIGN PATENT DOCUMENTS

JP    H10-160602 A    6/1998
JP    2002-082135 A   3/2002
(Continued)

*Primary Examiner* — Jean B Jeanglaude
(74) *Attorney, Agent, or Firm* — Posz Law Group, PLC

(57) ABSTRACT

An A/D conversion circuit includes: first/second pulse circulation circuits delaying an input signal and circulating a pulse signal; a circulation number difference measurement section outputting a difference between circulation time numbers of the pulse signal through the first/second pulse circulation circuits; a conversion control circuit outputting the difference as A/D conversion data when outputting a conversion data output processing signal; and a signal ratio change circuit: outputting, from a first output terminal, a voltage calculated by adding the reference voltage and a voltage obtained by multiplying a differential voltage, obtained by subtracting the reference voltage from the analog input voltage, by a first proportional coefficient; and outputting, from a second output terminal, a voltage calculated by subtracting, from the reference voltage, a voltage obtained by multiplying the differential voltage by a second proportional coefficient. The first/second pulse circulation circuits receive power source voltage supply from the first/second output terminals and a ground line.

12 Claims, 19 Drawing Sheets

(58) Field of Classification Search
USPC .................................... 341/161, 155, 156
See application file for complete search history.

(56) References Cited

U.S. PATENT DOCUMENTS

| | | | |
|---|---|---|---|
| 8,427,352 B2 * | 4/2013 | Tanizawa | H03M 1/0621 |
| | | | 324/522 |
| 9,350,370 B2 * | 5/2016 | Tanizawa | G01D 3/0365 |
| 2010/0156468 A1 | 6/2010 | Watanabe et al. | |
| 2011/0227560 A1 | 9/2011 | Haratani et al. | |
| 2012/0075137 A1 | 3/2012 | Tanizawa | |
| 2015/0358027 A1 | 12/2015 | Tanizawa | |

FOREIGN PATENT DOCUMENTS

| JP | 2002-082136 A | 3/2002 |
|---|---|---|
| JP | 2002-267692 A | 9/2002 |
| JP | 2008-122083 A | 5/2008 |
| JP | 2011-242270 A | 12/2011 |
| JP | 2012-063203 A | 3/2012 |

\* cited by examiner

FIG. 9A  (a) r=0.1
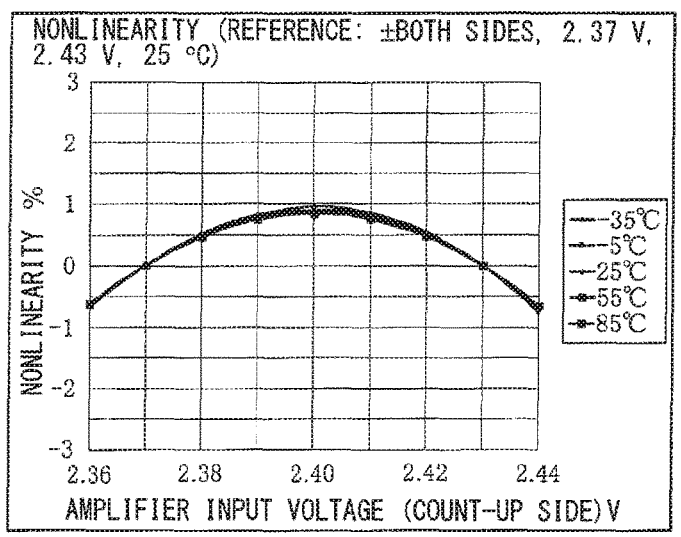
FIG. 9B  (b) r=1
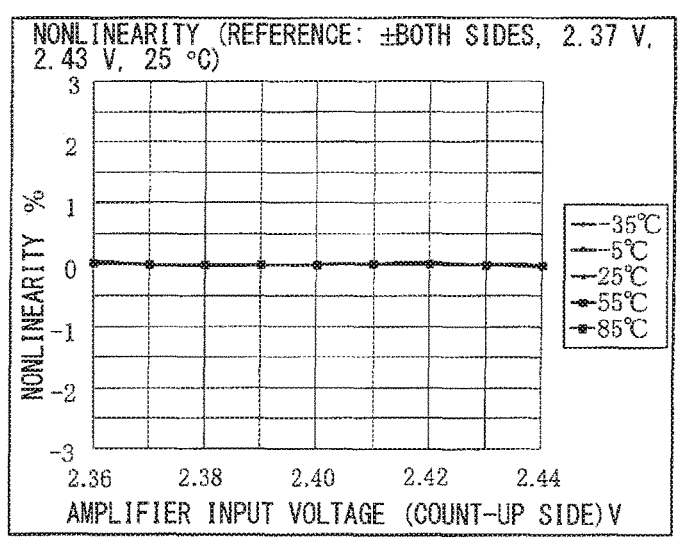
FIG. 9C  (c) r=10
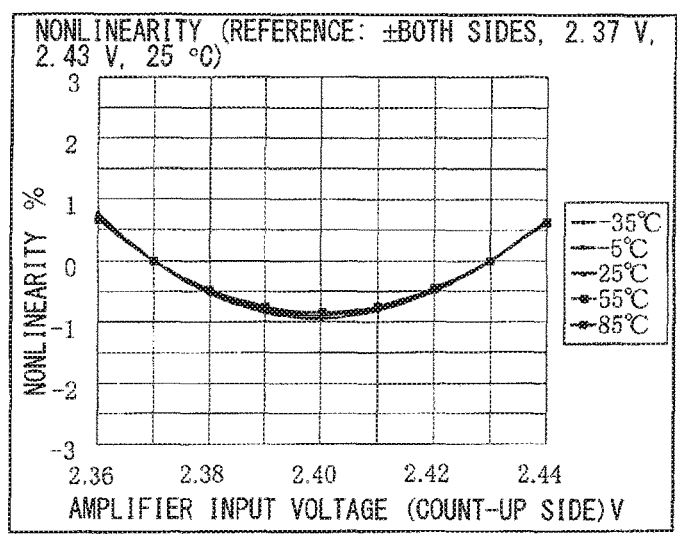

1/2 CYCLE SIGNAL Sh

US 9,608,659 B2

ANALOG/DIGITAL CONVERSION CIRCUIT

CROSS REFERENCE TO RELATED APPLICATIONS

This application is a U.S. national stage of International Application No. PCT/JP2015/002487 filed on May 18, 2015 and is based on Japanese Patent Applications No. 2014-103283 filed on May 19, 2014, and No. 2015-83317 filed on Apr. 15, 2015, the disclosures of which are incorporated herein by reference.

TECHNICAL FIELD

The present disclosure relates to an A/D conversion circuit using a pulse circulation circuit formed by connecting delay units in a ring shape.

BACKGROUND ART

There has been proposed an A/D conversion circuit of a type called time A/D (TAD) that includes a pulse circulation circuit (e.g., see Patent Literature 1). The pulse circulation circuit is configured by connecting delay units in a ring shape, the delay units delaying an input pulse signal by a delay time in accordance with a power source voltage and outputting the delayed signal. This A/D conversion circuit applies, as the power source voltage of the delay units, an analog input voltage that is to be A/D-converted, and counts the number of circulation of the pulse signal in the pulse circulation circuit, to obtain A/D conversion data on the basis of the counted value. The A/D conversion circuit of the TAD type has many advantages such as being able to be configured of a digital circuit element like a gate and having a relatively simple circuit configuration to achieve low cost.

However, in the A/D conversion circuit of the TAD type, A/D conversion data does not have favorable linearity (having nonlinearity). This is because a transmission characteristic of the pulse circulation circuit (the relation between the power source voltage and the number of circulation per unit time) is a characteristic that can be approximated not by a linear function but by a quadratic function. Accordingly, in the configuration of Patent Literature 1, pulse circulation circuits of two systems are combined to completely offset the above nonlinearity and ensure the linearity of the A/D conversion data.

When an attempt is made to constitute a sensor product for outputting a digital signal by combining a sensor element having the nonlinearity and an A/D conversion circuit where the linearity of A/D conversion data is favorably maintained as described above, the following problem occurs. That is, in this case, the nonlinearity of the sensor element appears as it is in A/D conversion data outputted from the A/D conversion circuit. This produces the need for correcting the nonlinearity included in the A/D conversion data to the linearity by digital operation or the like. As a result, a response time increases by the time required for the above correction operation and it is thus difficult to achieve fast responsiveness as the sensor device.

PRIOR ART LITERATURES

Patent Literature

Patent Literature 1: JP-2012-095264-A

SUMMARY OF INVENTION

It is an object of the present disclosure to provide an A/D conversion circuit capable of correcting nonlinearity of an analog input voltage without performing digital operation.

According to a first aspect of the present disclosure, an A/D conversion circuit for outputting A/D conversion data in accordance with a difference between an analog input voltage and a reference voltage, the A/D conversion circuit includes: a first pulse circulation circuit and a second pulse circulation circuit, each of which is provided by a plurality of delay units for delaying an input signal by a delay time that is determined in accordance with a power source voltage and for outputting a delayed input signal, and circulates a pulse signal through the delay units, the delay units being connected to each other in a ring shape; a circulation number difference measurement section that counts the number of circulation times of the pulse signal through the first pulse circulation circuit and the number of circulation times of the pulse signal through the second pulse circulation circuit, and outputs a differential value between counted numbers; a conversion control circuit that outputs a conversion data output processing signal for determining a timing to complete A/D conversion, and outputs the differential value outputted by the circulation number difference measurement section as A/D conversion data with respect to the analog input voltage; and a signal ratio change circuit that: sets a voltage, obtained by subtracting the reference voltage from the analog input voltage, as a differential voltage; outputs, from a first output terminal, a voltage calculated by adding the reference voltage and a first differential voltage obtained by multiplying the differential voltage by a first proportional coefficient; and outputs, from a second output terminal, a voltage calculated by subtracting, from the reference voltage, a second differential voltage obtained by multiplying the differential voltage by a second proportional coefficient having a same sign as the first proportional coefficient. Each delay unit of the first pulse circulation circuit receives a power source voltage supplied from the first output terminal of the signal ratio change circuit and a ground line. Each delay unit of the second pulse circulation circuit receives a power source voltage supplied from the second output terminal of the signal ratio change circuit and the ground line.

As thus described, the above A/D conversion circuit is configured in a similar manner to the foregoing configuration of the prior art with regard to the portion except for the signal ratio change circuit. Hence it is possible to obtain almost an equivalent effect to that of the configuration of the prior art, namely the effect of offsetting the nonlinearity of the TAD. In this case, however, due to the provision of the signal ratio change circuit, applied voltages to the delay units of the first and second pulse circulation circuits have mutually inversed increasing/decreasing polarities and have different absolute values. For this reason, in the configuration of the present means, only part of the nonlinearity of the TAD is offset.

The balance of the absolute values of the applied voltages to the delay units of the first and second pulse circulation circuits can be arbitrarily set by two proportional coefficients in the signal ratio change circuit, namely a first proportional coefficient and a second proportional coefficient. That is, the present means is configured so as to be able to arbitrarily change the nonlinearity of the TAD.

With such a configuration, when a sensor or the like which outputs an analog input voltage has the nonlinearity, by setting the nonlinearity of the TAD to a value with a positive/negative polarity inverted to that of the nonlinearity of the sensor, it is possible to offset the nonlinearity of the sensor. Thus, according to the present means, even when the sensor or the like which outputs an analog input voltage has the nonlinearity, it is not necessary to perform digital operation for correcting the nonlinearity included in A/D conversion data. As a result, fast responsiveness as the sensor device can be achieved.

BRIEF DESCRIPTION OF DRAWINGS

The above and other objects, features and advantages of the present disclosure will become more apparent from the following detailed description made with reference to the accompanying drawings. In the drawings:

FIGS. 9A to 9C are diagrams each showing the relation between an input voltage and nonlinearity;

EMBODIMENTS FOR CARRYING OUT INVENTION

Hereinafter, a plurality of embodiments of the present disclosure are described with reference to the drawings. In each of the embodiments, substantially the same configurations are provided with the same numeral, and a repeated description thereof is omitted.

First Embodiment

Hereinafter, a first embodiment of the present disclosure is described with reference to FIGS. 1 to 11.

Figure 1:
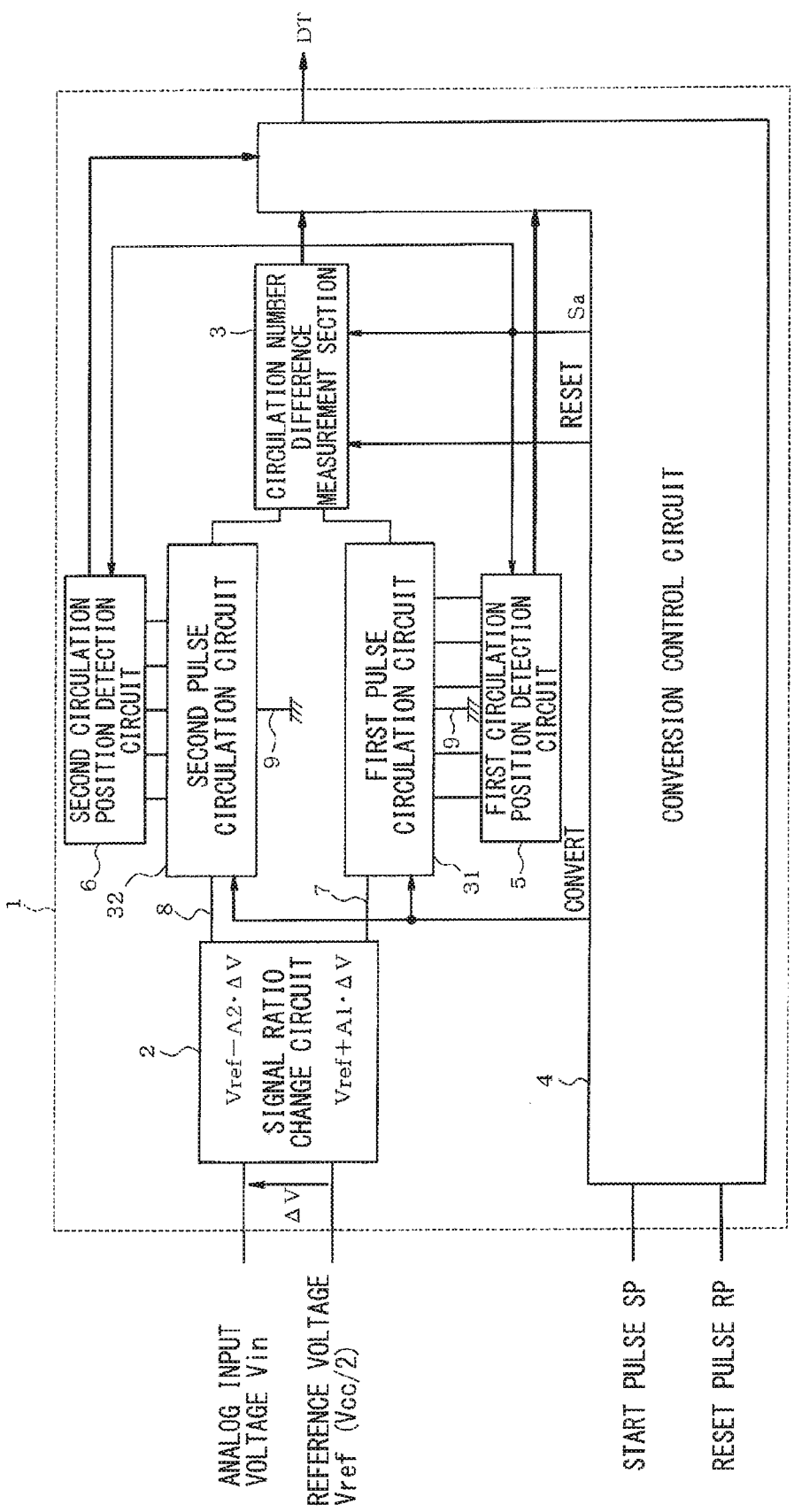
FIG. 1 is an overall configuration diagram of an A/D conversion circuit showing a first embodiment.

FIG. 1 shows a schematic configuration of an A/D conversion circuit of the present time A/D (TAD) type. The A/D conversion circuit 1 shown in FIG. 1 is formed in a semiconductor integrated circuit device, such as a microcomputer mounted in an electronic control unit (ECU) of a vehicle or a sensor product having a function of digital communication with an ECU, by a MOS manufacturing process. The A/D conversion circuit 1 inputs an analog signal outputted from a sensor or the like, converts its analog input voltage Vin (voltage to be converted) to a digital value in accordance with a difference from a reference voltage Vref, and outputs the digital value as A/D conversion data DT.

The A/D conversion circuit 1 includes a signal ratio change circuit 2, a circulation number difference measurement section 3, a conversion control circuit 4, a first circulation position detection circuit 5, a second circulation position detection circuit 6, a first pulse circulation circuit 31, a second pulse circulation circuit 32, and the like. The signal ratio change circuit 2 inputs the analog input voltage Vin and the reference voltage Vref. The signal ratio change circuit 2 includes a first output terminal that outputs a voltage obtained by adding a first differential voltage to the reference voltage Vref, and a second output terminal that outputs a voltage obtained by subtracting a second differential voltage from the reference voltage Vref. The first and second output terminals of the signal ratio change circuit 2 are respectively connected to power source lines 7, 8.

The first differential voltage is a voltage (=A1·ΔV) proportional to a differential voltage ΔV obtained by subtracting the reference voltage Vref from the analog input voltage Vin. The second differential voltage is a voltage (=A2·ΔV) which has the same sign as that of the first differential voltage. The second differential voltage is also a voltage proportional to the differential voltage ΔV, and has an absolute value different from that of the first differential voltage. That is, in the present embodiment, a proportional coefficient A1 (first proportional coefficient) of the differential voltage ΔV and the first differential voltage and a proportional coefficient A2 (second proportional coefficient) of the differential voltage ΔV and the second differential voltage are values different from each other (A1≠A2).

Note that the proportional coefficients A1 and A2 may be 1 or larger (amplification) or smaller than 1 (attenuation). When the proportional coefficients A1 and A2 are set to 1 or larger (amplification), the signal ratio change circuit 2 may be configured using an amplifying circuit or the like. Further, when the proportional coefficients A1 and A2 are set to smaller than 1 (attenuation), the signal ratio change circuit 2 may be configured using a voltage divider circuit by use of resistors, or the like.

The first and second pulse circulation circuits 31, 32 are configured such that a plurality of delay units that delays an input signal by a delay time, settled in accordance with a power source voltage are connected in a ring shape and the first and second pulse circulation circuits 31, 32 make a pulse signal circulate in these delay units. The delay unit of the first pulse circulation circuit 31 is configured so as to receive supply of the power source voltage from a power source line 7 and a ground line 9. The delay unit of the second pulse circulation circuit 32 is configured so as to receive supply of the power source voltage from a power source line 8 and the ground line 9.

The circulation number difference measurement section 3 counts the number of circulation of the pulse signal in the first pulse circulation circuit 31 and the number of circulation of the pulse signals in the second pulse circulation circuit 32, and outputs a differential value between the counted numbers. At this time, the circulation number difference measurement section 3 performs count-up and count-down every time the pulse signals are outputted from the delay units disposed in the same position (e.g., Nx at the final stage) in the first pulse delay circuit 31 and the second pulse delay circuit 32.

The conversion control circuit 4 receives input of a start pulse SP and a reset pulse RP which are supplied from the outside. On the basis of these pulses and the like, the conversion control circuit 4 determines the timing for starting A/D conversion and the timing for completing A/D conversion, and outputs the A/D conversion data DT. The first circulation position detection circuit 5 detects a pulse position in the first pulse circulation circuit 31 at the timing for completing the A/D conversion. The second circulation position detection circuit 6 detects a pulse position in the second pulse circulation circuit 32 at the timing for completing the A/D conversion.

Figure 2:
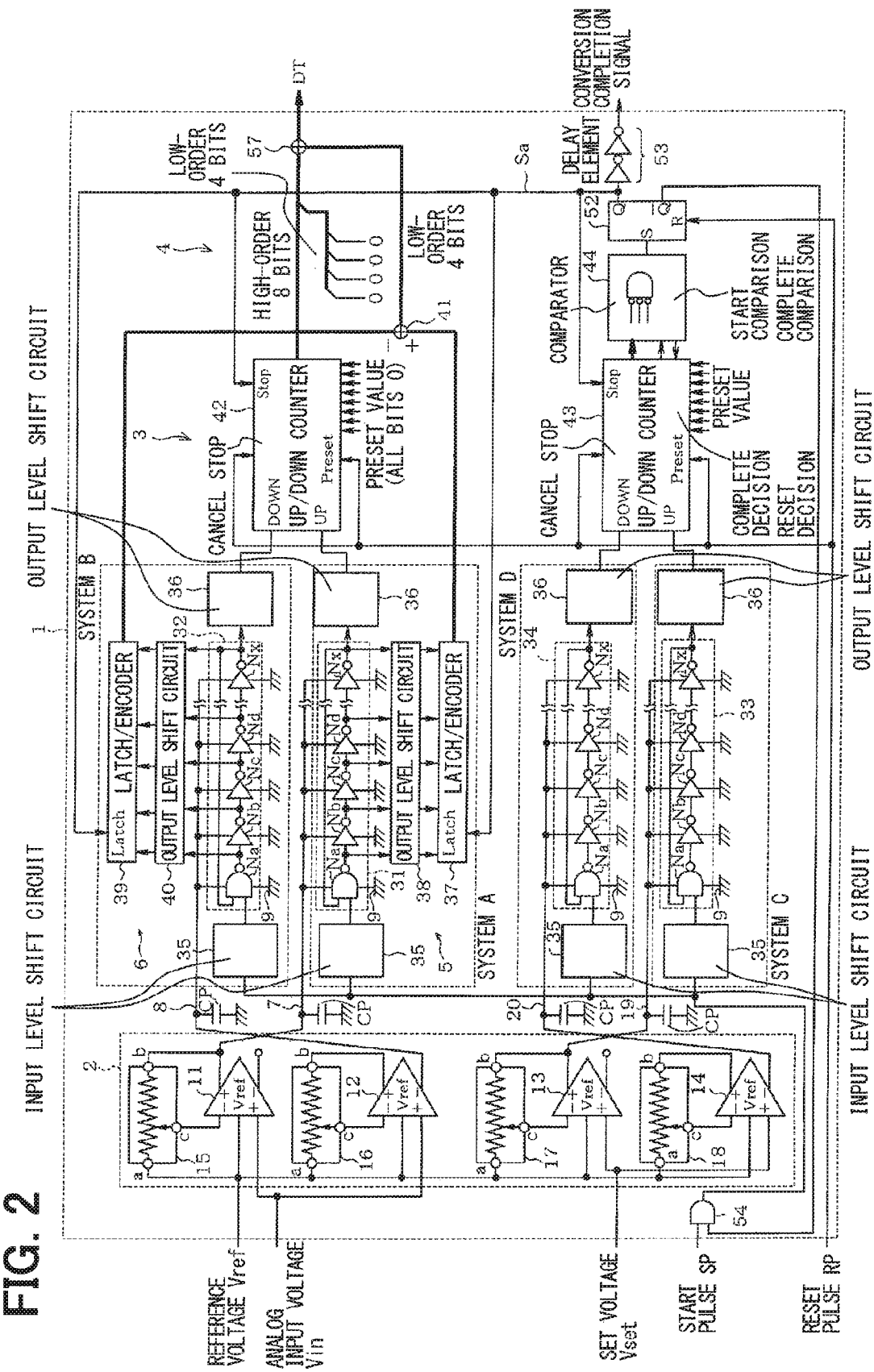
FIG. 2 is a diagram showing one specific configuration example of the A/D conversion circuit.

As a specific configuration of the A/D conversion circuit 1 having such a function, for example, a configuration as shown in FIG. 2 can be employed. As shown in FIG. 2, the signal ratio change circuit 2 includes full-differential amplifier circuits 11 to 14 and variable resistors 15 to 18. The full-differential amplifier circuits 11, 13 correspond to a first amplifying circuit, and the full-differential amplifier circuits 12, 14 correspond to a second amplifying circuit. The full-differential amplifier circuits 11 to 14 is provided with a common mode feedback circuit that is operated such that an average value of a non-inverted output voltage and an inverted output voltage (a central voltage of differential outputs) is a fixed value. In this case, the average value is set to a voltage to be inputted into a Vref terminal, and the reference voltage Vref is inputted into each of the Vref terminals of the full-differential amplifier circuits 11 to 14. Hence the central voltage of the differential output of the full-differential amplifier circuits 11 to 14 is equal to the reference voltage Vref.

A non-inverted input terminal of the full-differential amplifier circuit 11 is supplied with the analog input voltage Vin. An inverted input terminal of the full-differential amplifier circuit 11 is connected to a common terminal c of the variable resistor 15. The non-inverted output terminal of the full-differential amplifier circuit 11 is connected to the power source line 7, and is also connected to a terminal b of the variable resistor 15. The inverted output terminal of the full-differential amplifier circuit 11 is in a non-connected state. A terminal a of the variable resistor 15 is supplied with the reference voltage Vref.

A non-inverted input terminal of the full-differential amplifier circuit 12 is supplied with the analog input voltage Vin. An inverted input terminal of the full-differential amplifier circuit 12 is connected to a common terminal c of the variable resistor 16. The inverted output terminal of the full-differential amplifier circuit 12 is connected to the power source line 8. The non-inverted output terminal of the full-differential amplifier circuit 12 is connected to a terminal b of the variable resistor 16. A terminal a of the variable resistor 16 is supplied with the reference voltage Vref.

A non-inverted input terminal of the full-differential amplifier circuit 13 is supplied with a setting voltage Vset. An inverted input terminal of the full-differential amplifier circuit 13 is connected to a common terminal e of a variable resistor 17. The non-inverted output terminal of the full-differential amplifier circuit 13 is connected to a power source line 19, and is also connected to a terminal b of the variable resistor 17. The inverted output terminal of the full-differential amplifier circuit 13 is in a non-connected state. A terminal a of the variable resistor 17 is supplied with the reference voltage Vref.

A non-inverted input terminal of the full-differential amplifier circuit 14 is supplied with the setting voltage Vset. An inverted input terminal of the full-differential amplifier circuit 11 is connected to a common terminal c of a variable resistor 18. The inverted output terminal of the full-differential amplifier circuit 14 is connected to a power source line 20. The non-inverted output terminal of the full-differential amplifier circuit 14 is connected to a terminal b of the variable resistor 18. A terminal a of the variable resistor 18 is supplied with the reference voltage Vref.

The variable resistors 15 to 18 are configured such that a ratio of resistance between the terminals a and c and resistance between the terminals b and c can be changed while resistance between the terminals a and b is fixed. The ratios of the resistance of the variable resistors 15, 17 are the same, and change in conjunction with each other. Further, the ratios of the resistance of the variable resistors 16, 18 are the same, and change in conjunction with each other.

With such a configuration, the full-differential amplifier circuit 11 outputs a voltage shown in Formula (1) below from the non-inverted output terminal. Here, A1 is an amplification factor that is settled by a resistance value R1 between the terminals a and c of the variable resistor 15 and a resistance value R2 between the terminals b and c of the variable resistor 15. Further, $\Delta V$ is a differential voltage obtained by subtracting the reference voltage Vref from the analog input voltage Vin.

$$\text{Output voltage of full-differential amplifier circuit } 11 = V\text{ref} + A1 \cdot \Delta V \quad (1)$$

Further, the full-differential amplifier circuit 12 outputs a voltage shown in Formula (2) from the inverted output terminal. Here, A2 is an amplification factor that is settled by a resistance value R3 between the terminals a and c of the variable resistor 16 and a resistance value R4 between the terminals b and c of the variable resistor 16.

$$\text{Output voltage of full-differential amplifier circuit } 12 = V\text{ref} + A2 \cdot \Delta V \quad (2)$$

Therefore, the non-inverted output terminal of the full-differential amplifier circuit 11 corresponds to the first output terminal of the signal ratio change circuit 2, and the inverted output terminal of the full-differential amplifier circuit 12 corresponds to the second output terminal of the signal ratio change circuit 2. Note that the output voltages of the full-differential amplifier circuits 13, 14 can also be expressed by Formulas (1), (2) above. In this case, $\Delta V$ is a differential voltage obtained by subtracting the reference voltage Vref from the setting voltage Vset.

Figure 3:
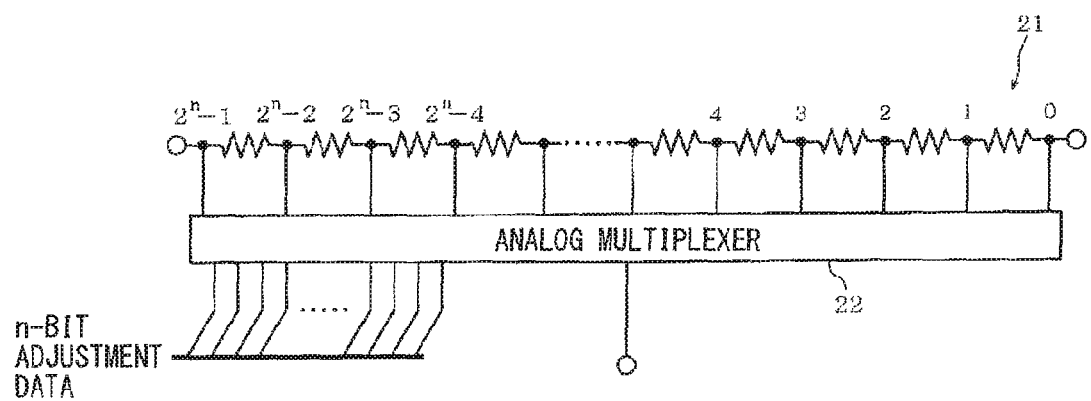
FIG. 3 is a configuration diagram of a digital variable resistor.

As the variable resistors 15 to 18, for example, a digital variable resistor (digital potential meter) as shown in FIG. 3 can be used. The digital variable resistor shown in FIG. 3 includes a plurality of resistors 21 and an analog multiplexer 22 that sets a connection form of the plurality of resistors 21 by a digital signal (adjustment data) inputted from the outside.

Figure 4:
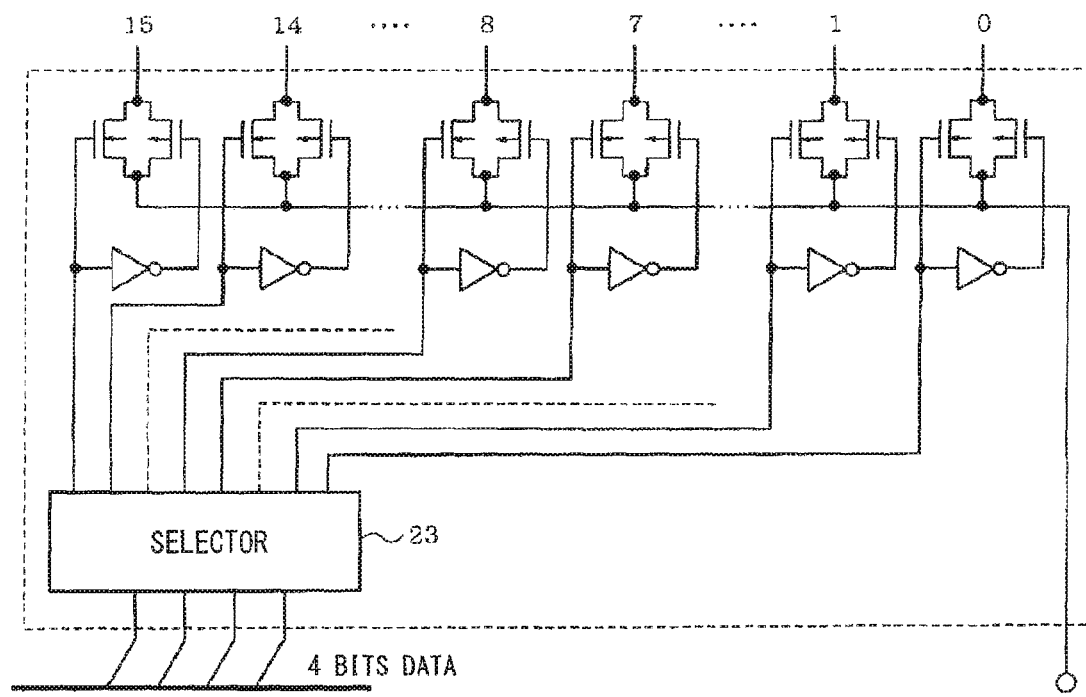
FIG. 4 is a configuration diagram of an analog multiplexer.

For example, as shown in FIG. 4, the analog multiplexer 22 is in a circuit form where a plurality of analog switches and an inverter (NOT circuit) are combined and receive input of a signal from a selector 23. Note that the analog switch is configured by connecting a p-channel MOS transistor and an n-channel MOS transistor in parallel.

In the present embodiment, the amplification factor A1 of the full-differential amplifier circuit 11 corresponds to a proportional coefficient (first proportional coefficient) of the differential voltage ΔV and the first differential voltage, and the amplification factor A2 of the full-differential amplifier circuit 12 corresponds to a proportional coefficient (second proportional coefficient) of the differential voltage ΔV and the second differential voltage. The variable resistors 15, 16 correspond to a signal ratio adjustment device that adjusts these proportional coefficients.

As shown in FIG. 2, the A/D conversion circuit 1 includes a third pulse circulation circuit 33 and a fourth pulse circulation circuit 34 in addition to the foregoing first and second pulse circulation circuits 31, 32. That is, the A/D conversion circuit 1 includes four pulse circulation circuits. In each of the pulse circulation circuits 31 to 34, the same number of a plurality of inverting circuits Na, Nb, . . . Nx (delay units) are connected in a ring shape, the circuits delaying an input signal by a delay time that is settled in accordance with a power source voltage and outputting the delayed signal.

The inverting circuit Na among the inverting circuits Na to Nx is configured of an NAND gate and the inverting circuits Nb to Nx are configured of inverters. The inverting circuits Nb to Nx of each of the pulse circulation circuits 31 to 34 are formed in the state of being thermally combined with each other. During a period when a start pulse SP of an H level is inputted into a non-ring-side input terminal of the NAND gate, the pulse signal is circulated in the inverting circuits Na to Nx at a speed settled in accordance with the power source voltage.

As for the four pulse circulation circuits 31 to 34, the first pulse circulation circuit 31 and the second pulse circulation circuit 32 are operated as a pair, and the third pulse circulation circuit 33 and the fourth pulse circulation circuit 34 are operated as a pair. The inverting circuits Na to Nx of the first pulse circulation circuit 31 is configured so as to receive supply of the power source voltage from the power source line 7 and the ground line 9. The inverting circuits Na to Nx of the second pulse circulation circuit 32 receive supply of the power source voltage from the power source line 8 and the ground line 9.

The inverting circuits Na to Nx of the third pulse circulation circuit 33 are configured so as to receive supply of the power source voltage from the power source line 19 and the ground line 9. The inverting circuits Na to Nx of the fourth pulse circulation circuit 34 are configured so as to receive supply of the power source voltage from the power source line 20 and the ground line 9. In this case, the reference voltage Vref is an intermediate potential of a voltage Vcc (e.g., 5 V) supplied to the A/D conversion circuit 1, for example, a ½ voltage (Vcc/2).

Bypass capacitors Cp are respectively provided between the power source lines 7, 8, 19, 20 and the ground line 9 that prevents a voltage drop due to an instantaneous through current at the time of inversion of the inverting circuits Na to Nx.

The circuit portions except for the pulse circulation circuits 31 to 34 in the A/D conversion circuit 1 are operated by receiving supply of the voltage Vcc. Since the voltage Vcc is different from the power source voltage of each of the pulse circulation circuits 31 to 34, a level shift circuit is required for inputting and outputting a signal to each of the pulse circulation circuits 31 to 34. An input level shift circuit 35 is provided before the inverting circuit (NAND gate) Na of each of the pulse circulation circuits 31 to 34. An output level shift circuit 36 is provided after the inverting circuit Nx of each of the pulse circulation circuits 31 to 34.

The first pulse circulation circuit 31 and the second pulse circulation circuit 32 are respectively provided with the first circulation position detection circuit 5 and the second circulation position detection circuit 6, each of the circuits 5 and 6 detecting pulse positions in the pulse circulation circuits at the output a conversion data output processing signal Sa which will be described later. The first circulation position detection circuit 5 is configured of a latch/encoder 37 and an output level shift circuit 38. The second circulation position detection circuit 6 is configured of a latch/encoder 39 and an output level shift circuit 40.

The latch/encoder 37 receives input of output signals of the inverting circuits Na to Nx of the first pulse circulation circuit 31 in parallel via the output level shift circuit 38. On the basis of these output signals, the latch/encoder 37 detects (encodes) a circulation position of the pulse signal in the first pulse circulation circuit 31. That is, when the conversion data output processing signal Sa of an H level is inputted into a latch command terminal of the latch/encoder 37, position data of the inverting circuits Na to Nx constituting the pulse circulation circuit 31 are latched, and a bit width (e.g., 4 bits) in accordance with those numbers is outputted. The latch/encoder 39 is configured in a similar manner. A subtractor 41 subtracts the position data outputted by the latch/encoder 39 from the position data outputted by the latch/encoder 37, and takes the subtracted value at the input of the conversion data output processing signal Sa as low-order data of low-order 4 bits of the A/D conversion data, for example. At the output of the conversion data output processing signal, the conversion control circuit 4 associates a difference between the pulse position inside the first pulse circulation circuit 31 and the pulse position inside the second pulse circulation circuit 32 with a predetermined number of bits, and takes the obtained data as low-order data of the A/D conversion data. An adder 57 takes an output value of a first counter 42 as high-order data of high-order bits, and adds the output value of the subtractor 41 to a value with the low-order 4 bits represented as "0000", to generate the A/D conversion data.

In the following description, for facilitating distinction of the four pulse circulation circuits 31 to 34, there are cases where a circuit made up of the first pulse circulation circuit 31, the latch/encoder 37, and the level shift circuits 35, 36, 38 is referred to as a "system A", a circuit made up of the second pulse circulation circuit 32, the latch/encoder 39, and the level shift circuits 35, 36, 40 is referred to as a "system B", a circuit made up of the third pulse circulation circuit 33 and the level shift circuits 35, 36 is referred to as a "system C", and a circuit made up of the fourth pulse circulation circuit 34 and the level shift circuits 35, 36 is referred to as a "system D."

The first counter 42 is an up/down counter of a first kind that counts the number of circulation of the pulse signal in the first pulse circulation circuit 31 and the number of circulation of the pulse signal in the second pulse circulation circuit 32 to output a differential value (e.g., 8 bits) between the counted numbers. The first counter 42 corresponds to the circulation number difference measurement section 3 in FIG. 1. A count-up input terminal (UP) receives input of an output signal of the inverting circuit Nx of the first pulse circulation circuit 31 via the output level shift circuit 36, and a count-down input terminal (DOWN) receives input of an output signal of the inverting circuit Nx of the second pulse circulation circuit 32 via the output level shift circuit 36.

A preset terminal and a stop cancel terminal receive input of a reset pulse RP of an H level for the A/D conversion circuit 1, and a stop terminal receives input of the conversion data output processing signal Sa of an H level. When the reset pulse RP is supplied to the preset terminal, preset data of the first counter 42 is set to all bits 0 (L level), and the output value of the first counter 42 at the point of input of the conversion data output processing signal Sa is taken as high-order 8 bits of the A/D conversion data, for example.

A second counter 43 is an up/down counter of a first kind that counts the number of circulation of the pulse signal in the third pulse circulation circuit 33 and the number of circulation of the pulse signal in the fourth pulse circulation circuit 34 to output a differential value (e.g., 8 bits) between the counted numbers. A count-up input terminal (UP) receives input of an output signal of the inverting circuit Nx of the third pulse circulation circuit 33 via the output level shift circuit 36, and a count-down input terminal (DOWN) receives input of an output signal of the inverting circuit Nx of the fourth pulse circulation circuit 34 via the output level shift circuit 36.

A preset terminal and a stop cancel terminal receive input of a reset pulse RP of an H level for the A/D conversion circuit 1, and a stop terminal receives input of the conversion data output processing signal Sa of an H level. When the reset pulse RP is supplied to the preset terminal, a value set in a ROM (2's complement of a prescribed value Y, or the prescribed value Y) as preset data.

A post stage of the second counter 43 is provided with a comparator 44 (determination circuit) that determines that all bits of the output value of the second counter 43 are 0. In order for the comparator 44 to be able to compare momentarily changing output values of the second counter 43 after decision of those values, the second counter 43 notifies the comparator 44 that a counted value has been decided.

When the counted value is decided, the second counter 43 outputs a decision completion signal (i.e., comparison start signal) of an H level to the comparator 44, and when a comparison completion signal (i.e., decision cancel signal) of an H level is inputted from the comparator 44, the second counter 43 returns the decision completion signal to the L level. When a change in output value of the second counter 43 may be so fast as to cause missing of some determination in the comparator 44, it can be considered that the low-order-bit side of the output value of the second counter 43 is not used for determination.

Figure 5:
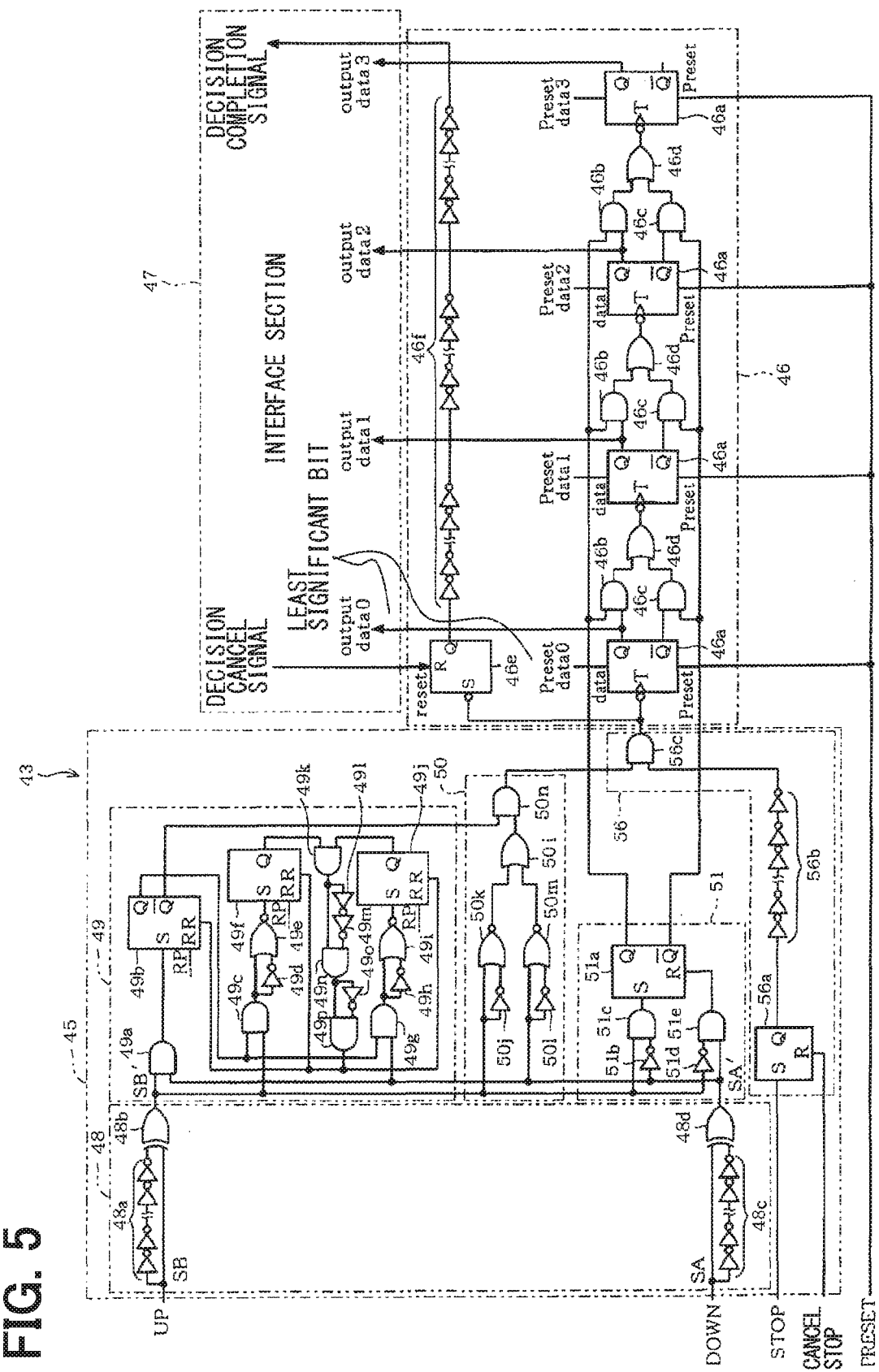
FIG. 5 is a configuration diagram of an up/down counter.
Figure 6:
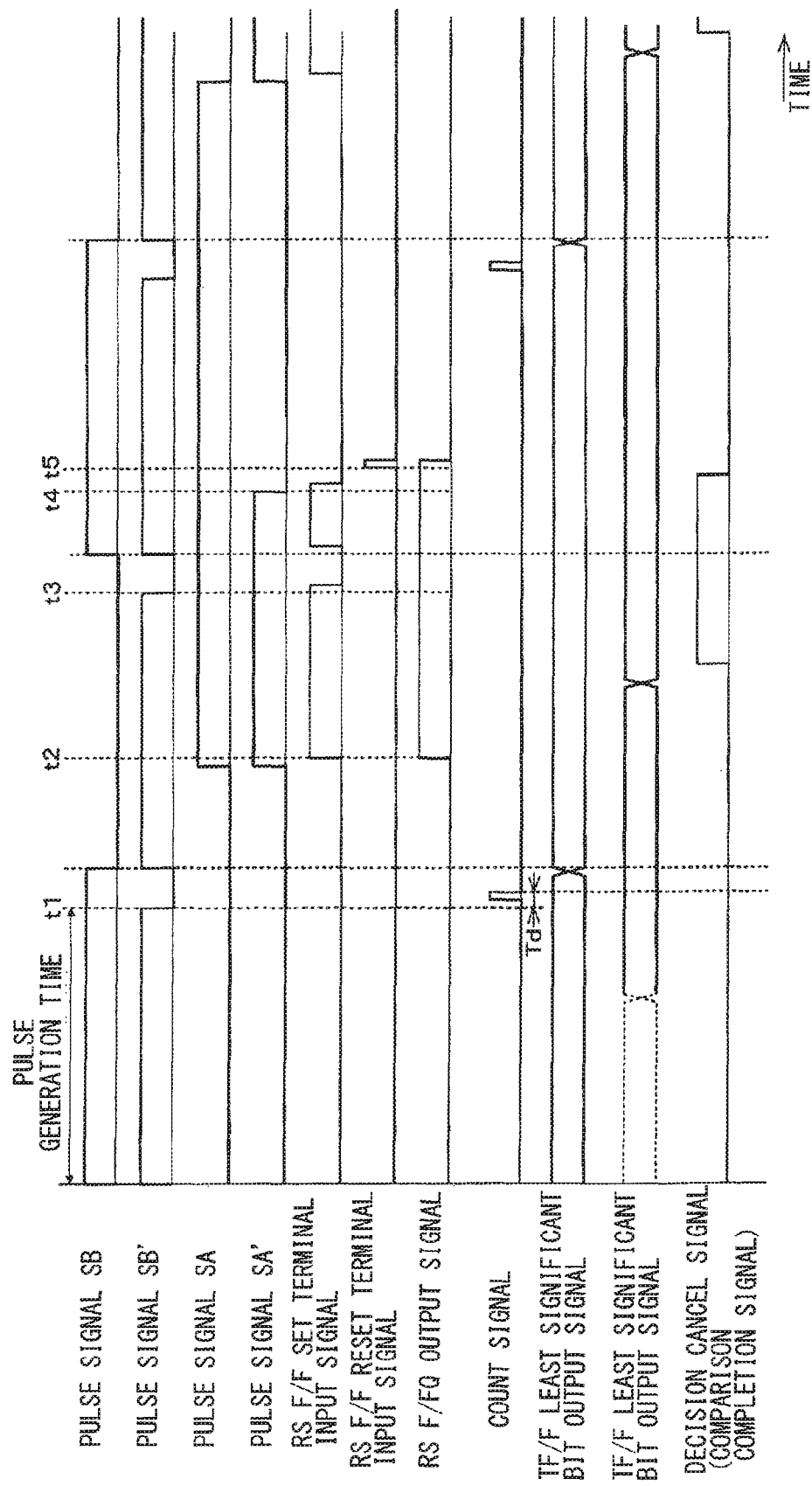
FIG. 6 is a timing chart for the up/down counter.

FIG. 5 shows a circuit configuration of the second counter 43, and FIG. 6 shows a timing chart. Although a configuration of 4 bits is shown here as a matter of convenience of display, a larger number of bits is practically used.

The second counter 43 includes the count-up input terminal (UP), the count-down input terminal (DOWN), the stop terminal (STOP; count stop terminal) for stopping counting, the stop cancel terminal (STOP cancel) for canceling the stopped counting, the preset terminal (PRESET), a preset data terminal, a decision completion signal terminal, and a decision cancel signal terminal. Although the first counter 42 has a similar configuration to that of the second counter 43, all bits L level is supplied to preset data, and the preset terminal is used as a reset terminal.

The second counter 43 is configured of an input section 45 that generates a count signal and a mode signal to direct count-up/count-down in accordance with an inputted pulse signal, a counter section 46 that performs count-up or count-down in accordance with the count signal and the mode signal, and an interface section 47 that outputs the counted value to the comparator 44. The preset data can be set to the counter section 46 by supplying a preset signal of an H level thereto.

The input section 45 is configured of a pulse generation section 48, an overlapping detection section 49, a count signal output section 50, a mode setting section 51, a count stop control section 56, and the like. The pulse generation section 48 is configured of an even number of inverters 48a, 48c and ExOR gates 48b, 48d. When pulse signals SB, SA are inputted into the count-up input terminal and the count-down input terminal, pulse signals SB', SA' of an H level with narrow widths are respectively generated in synchronization with an upward edge and a downward edge of the signals.

The overlapping detection section 49 monitors the occurrence or non-occurrence of an overlapping state where the pulse signal SB' being a count-up signal and the pulse signal SA' being a count-down signal are simultaneously inputted. When detecting the occurrence of the overlapping state, the overlapping detection section 49 outputs an overlapping detection signal of an L level to the count signal output section 50. At least after a lapse of the time corresponding to a delay time between the input and output in the count signal output section 50 from the point of completion of the overlapped two pulse signals, the overlapping detection section 49 stops outputting the overlapping detection signal (returns the signal to the H level).

Subsequently, operation of the overlapping detection section 49 is described in more detail. First, a reset terminal for starting counting is provided in each of RS flip-flops 49b, 49f, 49j, and resets by a stop cancel signal (reset pulse RP).

An AND gate 49a detects that the output of the ExOR gates 48b, 48d simultaneously shifts to the H level, namely the pulse signals SB', SA' overlap with each other. When the pulse signals SB', SA' overlap, the RS flip-flop 49b shifts a Q output from the L level to the H level and shifts a Q/output being the overlapping detection signal from the H level to the L level, to store the occurrence of the overlapping state. Note that an inverse signal of the Q output is represented with "/" added after Q. This storage of the overlapping state is maintained even after the output of the AND gate 49a returns to the L level. Subsequently, the RS flip-flop 49b resets the stored overlapping state on the condition that both the pulse signals SB', SA' once returned to the L level.

In accordance with the shift of the pulse signal SB' to the L level at the time of detection of the overlapping state, an AND gate 49c, an inverter 49d and a NOR gate 49e set a Q output of the RS flip-flop 49f to the H level. Similarly, in accordance with the shift of the pulse signal SA' to the L level at the time of detection of the overlapping state, an AND gate 49g, an inverter 49h and a NOR gate 49i set a Q output of the RS flip-flop 49j to the H level.

Here, a downward edge detection circuit is formed by combination of an odd number of inverters and NOR gate, like combination of the inverter 49d and the NOR gate 49e, and combination of the inverter 49h and the NOR gate 49i.

The same applies to combination of an inverter 50*j* and a NOR gate 50*k* and combination of an inverter 50*l* and a NOR gate 50*m* which are described later.

When the Q output of the RS flip-flops 49*f*, 49*j* both shifts to the H level, an AND gate 49*k* outputs a reset request signal of an H level. This reset request signal resets the RS flip-flops 49*b*, 49*f*, 49*j* via a rising delay circuit formed of an even number of inverters 49*l*, 49*m* and an AND gate 49*n* and via an upward edge detection circuit formed of an odd number of inverter 49*o* and an AND gate 49*p*. The delay time of the delay circuit is set to be not shorter than the delay time between the input and output in the count signal output section 50. When the RS flip-flop 49*b* is reset, the Q/output being the overlapping detection signal returns from the L level to the H level. Note that detection pulse width of the detection circuit and the delay time of the delay circuit can be adjusted by the number of inverters.

When the overlapping detection signal is at the H level, the count signal output section 50 outputs a count signal to the counter section 46 via the count stop control section 56 in accordance with input of the pulse signal into the count-up input terminal or the count-down input terminal, and when the overlapping detection signal is at the L level, the count signal output section 50 stops outputting the count signal to the counter section 46.

The inverter 50*j* and the NOR gate 50*k* output a count signal of an H level in synchronization with a downward edge of the pulse signal SB', and the inverter 50*l* and the NOR gate 50*m* output a count signal of an H level in synchronization with a downward edge of the pulse signal SA'. These count signals are outputted via an OR gate 50*i* and an AND gate 50*n*. The AND gate 50*n* allows passage of the count signal from the OR gate 50*i* when the overlapping detection signal is at the H level.

The mode setting section 51 switches the mode to a count-up mode or a count-down mode in accordance with which of the count-up input terminal or the count-down input terminal the pulse signal has been inputted. When the pulse signal is inputted into the count-up input terminal, the pulse signal SB' of an H level is generated in synchronization with the upward edge or the downward edge of the inputted pulse signal. Hence an RS flip-flop 51*a* is set via an inverter 51*b* and an AND gate 51*c*, and the mode is switched to the count-up mode. On the other hand, when the pulse signal is inputted into the count-down input terminal, the pulse signal SA' of an H level is generated in synchronization with the upward edge or the downward edge of the inputted pulse signal. Hence the RS flip-flop 51*a* is reset via an inverter 51*d* and an AND gate 51*e*, and the mode is switched to the count-down mode.

The count stop control section 56 stops the count operation in accordance with input of the conversion data output processing signal Sa into the stop terminal, and resumes the count operation in accordance with input of the reset pulse RP (stop cancel signal) into the stop cancel terminal. That is, when the conversion data output processing signal Sa is inputted, an RS flip-flop 56*a* is set, and an AND gate 56*c* comes into a cut-off state via an odd number of inverters 56*b*. When a cancel signal is inputted, the RS flip-flop 56*a* is reset, and the AND gate 56*c* comes into a passage state.

The counter section 46 is an asynchronous counter including a T flip-flop 46*a* corresponding to the number of bits and a ripple carry circuit made up of AND gates 46*b*, 46*c* and an OR gate 46*d*. When a preset signal of an H level is inputted into a preset terminal of the T flip-flop 46*a*, preset data is set. The RS flip-flop 46*e* is set in synchronization with the downward edge of the count signal. An even number of inverters 46*f* have a longer delay time than the time required for ripple-carry and count operation. An output signal of the inverter 46*f* is the foregoing decision completion signal, and a signal that gets into a reset terminal of the RS flip-flop 46*e* is the decision cancel signal.

The timing chart shown in FIG. 6 represents, sequentially from above, the count-up pulse signals SB, SB', the count-down pulse signals SA, SA', a set terminal input signal of the RS flip-flop 49*b*, a reset terminal input signal (reset request signal after delay) of the RS flip-flop 49*b*, an Q output signal of the RS flip-flop 49*b* (an inverse signal of an overlapping detection signal), an output signal (count signal) of the AND gate 56*c*, a least-significant-bit output of the T flip-flop 46*a*, a most-significant-bit output of the T flip-flop 46*a*, and a decision cancel signal (comparison completion signal).

The pulse signals SB', SA' are respectively generated in synchronization with the upward edge and the downward edge of the pulse signals SB, SA. At a time t1, since no overlap has occurred between the pulse signal SB' and the pulse signal SA', the overlapping detection signal (the inverse signal of the RS flip-flop 49*b*) is at the H level, and after a gate delay time Td of the count signal output section 50, the count signal being the downward edge from a narrow H level is outputted with respect to the downward edge of the pulse signal SB'.

When overlap occurs between the pulse signals SB', SA' at a time t2, after a lapse of a delay of the AND gate 49*a*, the RS flip-flop 49*b* is set and the occurrence of the overlapping state is stored. When the pulse signal SB' falls at a time t3, the Q output of the RS flip-flop 49*f* is set to the H level (detection of the fall of the pulse signal SB' after the storage of the overlapping state).

When the pulse signal SA' falls at a time t4, the Q output of the RS flip-flop 49*j* is set to the H level (detection of the fall of the pulse signal A' after the storage of the overlapping state). At this point, since both the up-pulse signal SB' and the down-pulse signal SA' have come into the fallen state, the reset request signal is generated and the RS flip-flops 49*b*, 49*f*, 49*j* are reset, to cancel the overlapping state (time t5).

In order to prevent erroneous generation of the count signal (the output signal of the AND gate 56*c*) during the overlap, a delay time from the point at which both the pulse signals SB', SA' are completed until the overlapping state is canceled (until the overlapping detection signal shifts to the H level) is set at least longer than the time Td shown in the figure (the time corresponding to the delay time between the input and output in the count signal output section 50).

In the present embodiment, every time the counted value of the second counter 43 increases or decreases by 1, the comparator 44 can make comparison as to whether all bits are 0. For this, the comparator 44 may complete digital comparison operation during the increase or decrease of the counted value by 1. Practically, an operation time of the second counter 43 (mainly a transmission time of the counter section 46) controls a rate of a series of operation of the count operation by the second counter 43 and the digital comparison operation by the comparator 44.

A pulse generation time shown in FIG. 6 is a time from the point of input of the count-up pulse signal SB and the count-down pulse signal SA until the fall of the pulse signals SB', SA'. Since the second counter 43 generates and counts the count signal at the point of fall of each of the pulse signals SB', SA', the pulse generation time corresponds to a standby time until the next count signal is generated during the count operation of the previously inputted pulse signals SB, SA. Hence it is necessary to set the pulse generation time to be longer than the operation time of the counter 43. As a result, there is a need for the relation: digital comparison operation time of comparator 44<counter operation time<pulse generation time.

While the output of the pulse circulation circuits 33, 34 repeat 1 (H level) and 0 (L level) for every circulation, the second counter 43 generates the count signal both in the rise and fall, thus requiring the relation: pulse generation time<minimum time for one circulation of pulse circulation circuit. From the above, there is a need for the relation: digital comparison operation time of comparator 44<counter operation time<pulse generation time<minimum time for one circulation of pulse circulation circuit.

Now, in FIG. 2, when a comparison result signal of an H level indicating all bits 0 is outputted from the comparator 44, an RS flip-flop 52 is set, and from its Q output, the conversion data output processing signal Sa of an H level is outputted. The conversion data output processing signal Sa is supplied to stop terminals of the counters 42, 43 and latch command terminals of the latch/encoders 37, 39, and turns into a conversion completion signal via a delay element made up of the inverter 53. Further, the Q/output of the RS flip-flop 52 is inputted into the AND gate 54. Although the start pulse SP has been supplied to the level shift circuit 35 via the AND gate 54, since the output of the AND gate 54 shifts to the L level in synchronization with the Q/output of the RS flip-flop 52 shifting to the L level at the point of completion of the conversion, the circulation of the pulse signal is stopped. When the A/D conversion is to be performed again, the start pulse SP may once be set to the L level, and thereafter, the RS flip-flop 52 may be reset by input of the reset pulse RP to resume the A/D conversion.

Of the configurations described above, the subtractor 41, the adder 57, the comparator 44, the RS flip-flop 52, and the AND gate 54 constitute the conversion control circuit 4. The conversion control circuit 4 simultaneously starts the pulse circulation operation of the first to fourth pulse circulation circuits 31 to 34. When a differential value outputted by the second counter 43 reaches the previously set prescribed value Y, the conversion data output processing signal Sa is outputted, and a differential value outputted by the first counter 42 and the latch/encoders 37, 39 at that time is outputted as A/D conversion data with respect to the analog input voltage Vin.

Now, in the configuration disclosed in JP-2012-095264-A (hereinafter also referred to as the configuration of the prior art), the nonlinearity of the TAD is offset by combination of the system A and the system B of the pulse circulation circuits of the four systems, and similarly, the non-linearity of the TAD is offset by combination of the system C and the system D of the four systems. Further, in the configuration of the prior art, temperature characteristics of the system A and the system B are offset by temperature characteristics of the system C and the system D. In this case, applied voltages to the respective delay units of the system A and the system B have increasing/decreasing polarities inverse to each other and have the same absolute value. Accordingly, the nonlinearity of the TAD is completely offset.

On the other hand, the A/D conversion circuit 1 of the present embodiment is configured in a similar manner to the configuration of the prior art except for the signal ratio change circuit 2. Thus, according to the A/D conversion circuit 1 of the present embodiment, it is possible to obtain a similar effect to that of the configuration of the prior art, namely the effect of offsetting the nonlinearity and the temperature characteristic of the TAD. However, in the A/D conversion circuit 1 of the present embodiment, due to the provision of the signal ratio change circuit 2, the applied voltages to the respective delay units of the system A and the system B have increasing/decreasing polarities inverse to each other and have absolute values not the same as (different from) each other. Hence in the A/D conversion circuit 1 of the present embodiment, only a part of the nonlinearity of the TAD is offset (corrected).

Hereinafter, there is described a way of thought of the nonlinearity correction in the present embodiment.

Figure 7:
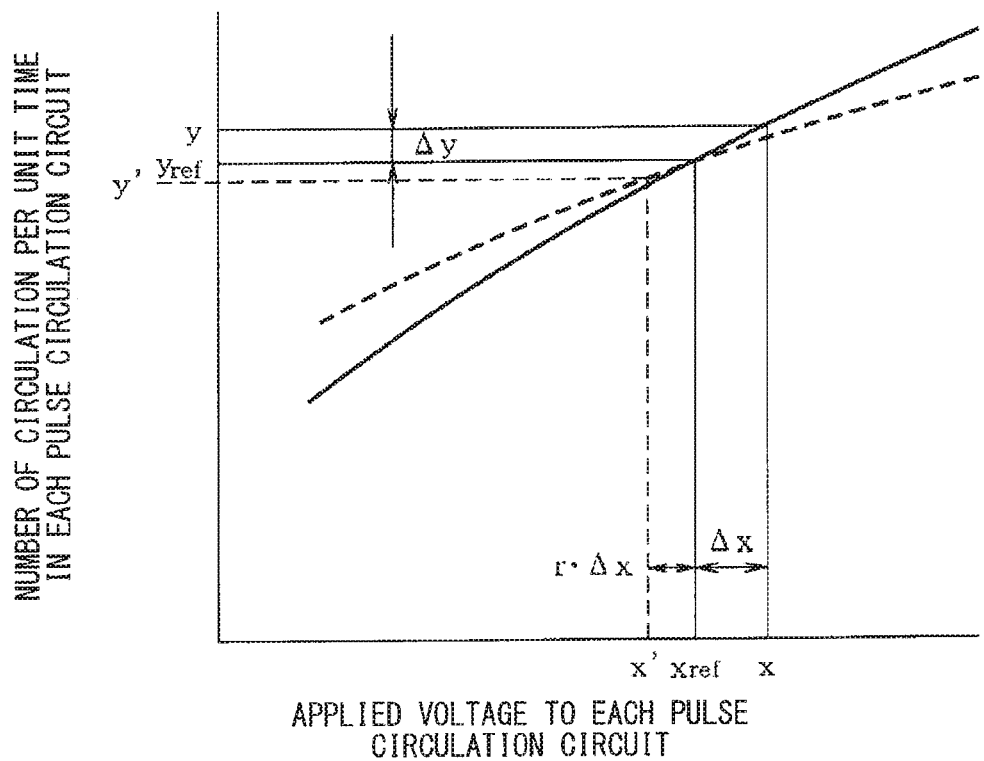
FIG. 7 is a diagram showing the relation between an applied voltage to a pulse circulation circuit and the number of circulation per unit time.

FIG. 7 is a diagram schematically showing the relation between the applied voltage to each of the pulse circulation circuits 31 to 34 of the four systems and the number of circulation per unit time. According to the configuration of the A/D conversion circuit 1, Formula (3) and Formula (4) always hold with respect to a reference voltage xref when x is the power source voltage applied to the pulse circulation circuit 31 of the system A, and x' is the power source voltage applied to the pulse circulation circuit 32 of the system B.

$$x = x\text{ref} + \Delta x \quad (3)$$

$$x' = x\text{ref} - r \cdot \Delta x \quad (4)$$

That is, when the applied voltage of the pulse circulation circuit 31 of the system A increases by "$\Delta x$", the applied voltage of the pulse circulation circuit 32 of the system B decreases by "$r \cdot \Delta x$", and a voltage at the time when the applied voltages of the pulse circulation circuits 31, 32 of the systems A, B are equal is xref. Here, r is a ratio of the amplification factors A1, A2 of the full-differential amplifier circuits 11, 12, and is expressed by Formula (5) below.

$$r = \text{amplification factor } A2/\text{amplification factor } A1 \quad (5)$$

Further, the characteristics of the pulse circulation circuits of the systems A to D shown in FIG. 7 can be approximated by quadratic functions shown in Formula (6) and Formula (7) with an arbitrary reference voltage xref at the center (slightly have a quadratic component). Here, y, y' are the numbers of circulation per unit time at the time when the power source voltages x, x' are applied to the pulse circulation circuits 31, 32 of the systems A, B. Further, a coefficient A is a quadratic coefficient with respect to $\Delta x$, and a coefficient B is a linear coefficient with respect to $\Delta x$.

$$y = A \cdot (\Delta x)^2 + B \cdot (\Delta x) + y\text{ref} \quad (6)$$

$$y' = A \cdot (-r \cdot \Delta x)^2 + B \cdot (-r \cdot \Delta x) + y\text{ref} \quad (7)$$

Formula (8) below holds by Formula (6) and Formula (7) above, $$y - y' = (1 - r^2) \cdot A \cdot (\Delta x)^2 + (1 + r) \cdot B \cdot (\Delta x) \quad (8)$$

It is found from Formula (8) above that a difference in number of circulation "y−y'" per unit time has no relation to yref. Further, when "r=1", namely when "amplification factor A1=amplification factor A2", the quadratic component (the first term on the right side of Formula (8)), which is a nonlinear component with respect to the voltage change $\Delta x$, is "0", and thus favorable linearity can be obtained as in the configuration of the prior art. It is then found that the nonlinearity is obtained when "r≠1", namely when "amplification factor A1≠amplification factor A2."

Figure 8:
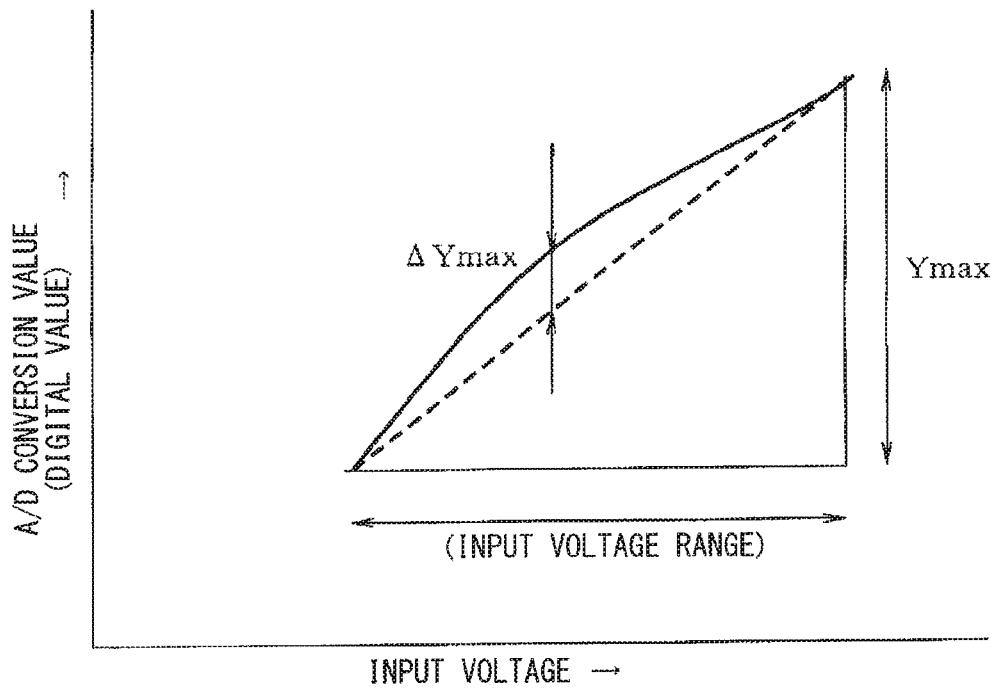
FIG. 8 is a diagram for explaining the definition of nonlinearity in the A/D conversion circuit.

Here, the "nonlinearity" of the A/D conversion circuit 1 is defined as Formula (9) below based on FIG. 8. That is, Ymax is a change width of the A/D conversion data (digital value) in an input voltage range of the A/D conversion circuit 1, and ΔYmax is the maximum value of an error with respect to a straight line (indicated by a broken line in FIG. 8) in a case where the A/D conversion data linearly changes with respect to an input voltage.

$$\text{nonlinearity [\%]} = (\Delta Y\text{max}/Y\text{max}) \times 100 \quad (9)$$

Subsequently, there are described an estimation result of nonlinearity correction and a method for application to sensor nonlinearity correction according to the present embodiment.

FIGS. 9A to 9C each show the ratio r of the amplification factors and a nonlinearity error (evaluation result) in changing the amplification factor A1 of the applied voltages to the systems A, C and the amplification factor A2 of the applied voltages to the systems B, D in the A/D conversion circuit 1 in conjunction with each other based on data in a predetermined semiconductor process. FIG. 9A shows a case where the ratio r is 0.1 (A1=10, A2=1), FIG. 9B shows a case where the ratio r is 1 (A1=10, A2=10), and FIG. 9C shows a case where the ratio r is 10 (A1=1, A2=10). Here, the reference voltage Vref is 2.4 V, an input voltage range is 2.4 V±0.03 V (2.37 to 2.43 V), and an error with respect to an output range at this time is shown.

As shown in FIGS. 9A to 9C, in the A/D conversion circuit 1 of the present embodiment, both convex nonlinearity in FIG. 9A and concave nonlinearity in FIG. 9C can be achieved by changing the ratio r of the amplification factors. Specifically, the convex nonlinearity can be achieved when the amplification factor A1 is set larger than the amplification factor A2 (r<1), and the concave nonlinearity can be achieved when the amplification factor A1 is set smaller than the amplification factor A2 (r>1). As shown in FIG. 9B, a flat characteristic is obtained when r=1, and this corresponds to a characteristic similar to the configuration of the prior art.

Figure 10:
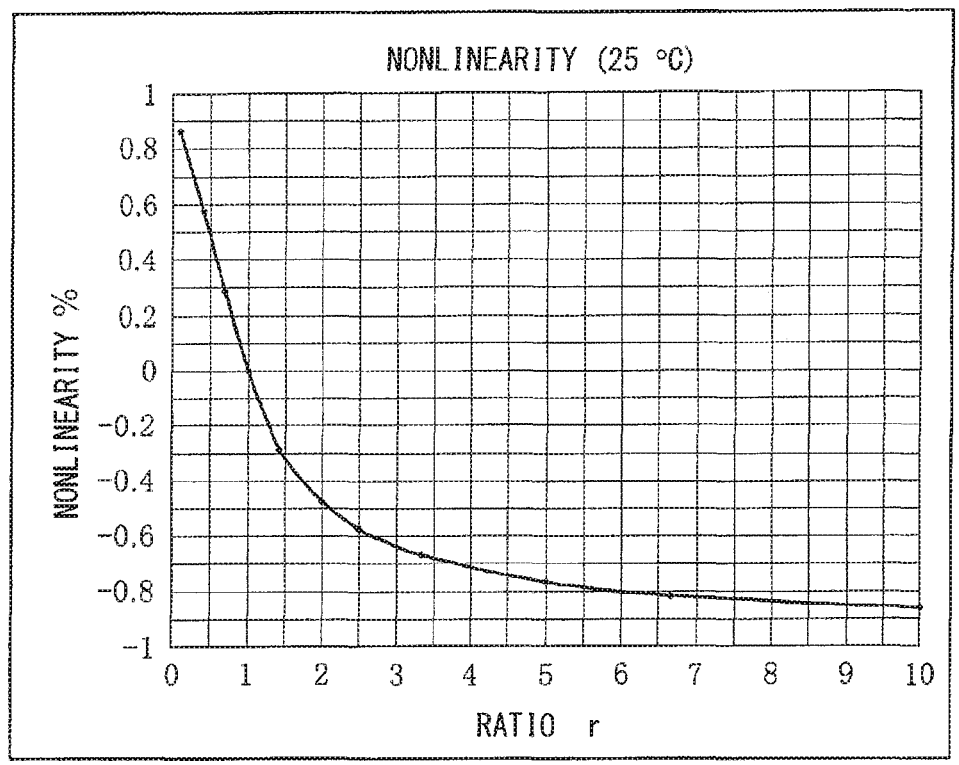
FIG. 10 is a diagram showing the relation between a ratio of amplification factors and nonlinearity.

FIG. 10 shows the relation between the maximum value of the error (nonlinearity) in the input voltage range (a center value of the input voltage range=2.4 V) and the ratio r of the amplification factors in FIGS. 9A to 9C. As shown in FIG. 10, it is found that the nonlinearity changes in the range of about ±0.8% when the ratio r is in the range of 0.1 (1:10) to 10 (10:1). In this case, the maximum value of the nonlinearity is restricted by original nonlinearity of the pulse circulation circuit of one system. Further, the input voltage range needs to be selected to be such a range where the flat characteristic is obtained when the ratio r of the amplification factors is 1 (FIG. 9B). For this reason, the amplification factors A1, A2 are set to be not larger than "10" here.

With such a configuration, when a sensor or the like which outputs the analog input voltage Vin to be a target of the A/D conversion by the A/D conversion circuit 1 has the nonlinearity (nonlinear characteristic), it is possible to completely offset the nonlinearity of the sensor, by setting the nonlinearity in the A/D conversion circuit 1 to a value with a positive/negative polarity inverted to that of the nonlinearity of the sensor.

Figure 11:
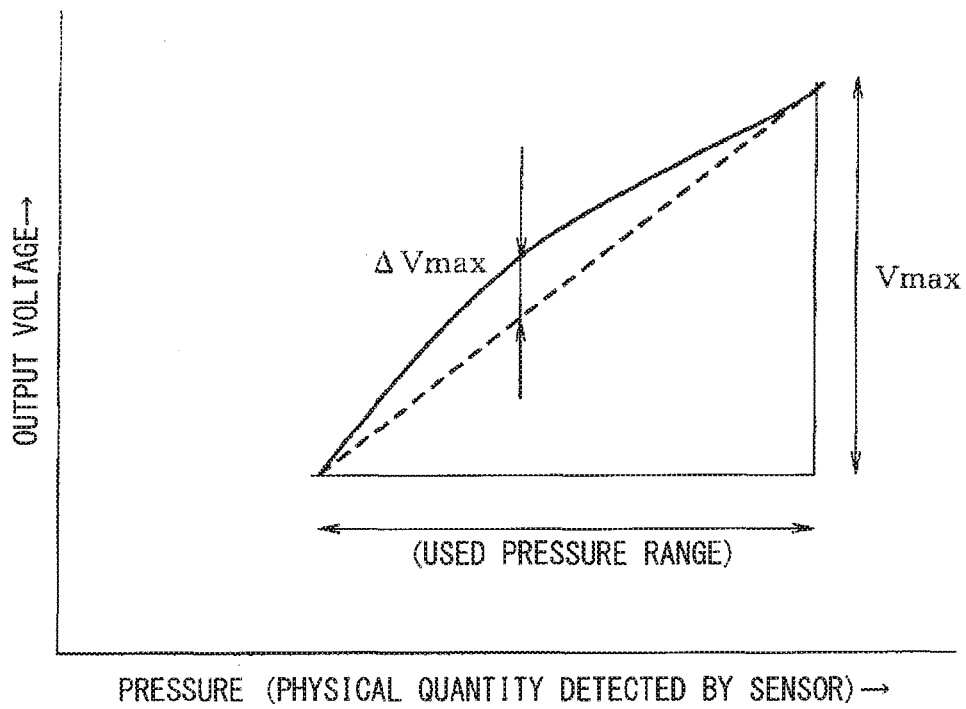
FIG. 11 is a diagram for explaining the definition of nonlinearity in a sensor.

Note that the "nonlinearity" in the sensor is defined as in Formula (10) below. Here, as shown in FIG. 11, Vmax is a change width of a sensor output signal (output voltage) in a range of a physical quantity (e.g., pressure) detected by the sensor, and ΔVmax is the maximum value of an error with respect to a straight line (indicated by a broken line in FIG. 11) in a case where the output voltage linearly changes with respect to the physical quantity.

$$\text{nonlinearity [\%]} = (\Delta V\text{max}/V\text{max}) \times 100 \quad (10)$$

For example, when the nonlinearity of the sensor is "+0.4%", it is possible to completely offset the nonlinearity of the sensor, by setting the nonlinearity of the A/D conversion circuit 1 to "−0.4%". When the nonlinearity of the A/D conversion circuit 1 is set to "−0.4%", the ratio r of the amplification factor may be set to about "1.75" (amplification factor A1≈5.7, amplification factor A2=10).

Subsequently, a specific sequence of the A/D conversion is described. First, the reset pulse RP is supplied, and the first counter 42 and the RS flip-flop 52 shown in FIG. 2 are reset. At the same time, the prescribed value Y is preset in the second counter 43. When the setting voltage Vset to be used is higher than the reference voltage Vref, the counted value of the second counter 43 increases, and hence 2's complement of the prescribed value Y is preset in the second counter 43. On the contrary, when the setting voltage Vset to be used is lower than the reference voltage Vref, the counted value of the second counter 43 decreases, and hence the prescribed value Y is present in the second counter 43.

In the following description, describing that the second counter 43 counts the prescribed value Y includes both the case of presetting the 2's complement of the prescribed value Y and the case of presetting the prescribed value Y except for an apparently unsuitable case in terms of function.

Subsequently, the start pulse SP, which is kept at the H level at least during the A/D conversion period is supplied. Since the Q/output of the RS flip-flop 52 is at the H level due to the above reset, upon input of the start pulse SP, the pulse circulation circuits 31 to 34 of the systems A to D simultaneously start the pulse circulation operation. In the systems A, B, the first counter 42 performs count-up every time the pulse is circulated in the pulse circulation circuit 31 of the system A, and the first counter 42 performs count-down every time the pulse is circulated in the pulse circulation circuit 32 of the system B.

Meanwhile, in the systems C, D, the second counter 43 performs count-up every time the pulse is circulated in the pulse circulation circuit 33 of the system C, and the second counter 43 performs count-down every time the pulse is circulated in the pulse circulation circuit 34 of the system D. The second counter 43 outputs a decision completion signal to the comparator 44 when the counted value is decided in the interface section 47 (cf. FIG. 5) inside the second counter 43. The comparator 44 determines whether or not the output value of the second counter 43 is all bits 0, and when completing the determination, the comparator 44 outputs a comparison completion signal (decision cancel signal) to the second counter 43. When the second counter 43 counts only the prescribed value Y from an initial preset state and the value reaches all bits 0, the RS flip-flop 52 is set, and the conversion data output processing signal Sa of an H level is outputted. This conversion data output processing signal Sa turns into a conversion completion signal to the external circuit.

When the conversion data output processing signal Sa shifts to the H level, the AND gate 54 is closed, and the pulse circulation circuits 31 to 34 stop the pulse circulation operation. At the same time, the first counter 42 of the systems A, B is stopped, and outputs a differential value, obtained by subtracting the number of circulation of the pulse signal in the second pulse circulation circuit 32 from the number of circulation of the pulse signal in the first pulse circulation circuit 31, with an 8-bit width. The latch/encoders 37, 39 respectively latch position data indicating the positions of the pulse signals in the pulse circulation circuits 31, 32, and output the latched data. The subtractor 41 subtracts the position data outputted by the latch/encoder 39 from the position data outputted by the latch/encoder 37, and outputs the subtracted value with a 4-bit width. When a carry (positive value) or a borrow (negative value) are generated in this subtraction, the generated value is carried by the adder 57 to the high-order 8-bit data. The 12 bit-data as a total of the high-order 8-bit data and the low-order 4-bit data is the A/D conversion data DT.

As described above, the A/D conversion circuit 1 of the present embodiment includes: the first and second pulse circulation circuits 31, 32 of the systems A, B in which power source voltages obtained by adding differential voltages with mutually inversed polarities to the reference voltage are applied to the delay units; the third and fourth pulse circulation circuits 33, 34 of the systems C, D in which power source voltages obtained by adding differential voltages with mutually inversed polarities to the reference voltage are applied to the delay unit in a similar manner to the above; the first counter 42 that counts a difference in number of circulation between the first and second pulse circulation circuits 31, 32; and the second counter 43 that counts a difference in number of circulation between the third and fourth pulse circulation circuits 33, 34.

With this configuration, after simultaneous application of the start pulse SP to the pulse circulation circuits 31 to 34, the counted value of the first counter 42 (the differential value of the numbers of circulation of the pulse) and the differential value of the pulse positions of the latch/encoders 37, 39 at the point when the second counter 43 counts the prescribed value Y are obtained, and data with the obtained counted value taken as the high-order bits and the obtained differential value taken as the low-order bits are the A/D conversion data of the analog input voltage Vin seen from the reference voltage Vref.

Thus, according to the A/D conversion circuit 1 of the present embodiment, it is possible to obtain a similar effect to that of the configuration of the prior art, namely the effect of offsetting the nonlinearity and the temperature characteristic of the TAD. However, in the A/D conversion circuit 1, due to the provision of the signal ratio change circuit 2, the applied voltages to the respective delay units of the system A and the system B have mutually different absolute values. Hence in the A/D conversion circuit 1, only part of the nonlinearity of the TAD is offset. Then, the balance of the absolute values of the applied voltages to the systems A, B can be arbitrarily set by the ratio r of the amplification factors A1, A2 of the full-differential amplifier circuits 11, 12. That is, the A/D conversion circuit 1 is configured so as to be able to arbitrarily change the nonlinearity.

With such a configuration, when the sensor or the like which outputs a voltage to be converted (analog input voltage Vin) has the nonlinearity, it is possible to completely offset the nonlinearity of the sensor, by setting the nonlinearity in the A/D conversion circuit 1 to a value with a positive/negative polarity inverted to that of the nonlinearity of the sensor. Thus, according to the present embodiment, even when the sensor or the like which outputs a voltage to be converted has the nonlinearity, it is not necessary to perform digital operation for correcting the nonlinearity included in A/D conversion data. As a result, fast responsiveness as the sensor device can be achieved.

Further, in the A/D conversion circuit 1, resistance ratios of the variable resistors 15 to 18, namely the amplification factors A1, A2, can be changed by use of adjustment data. With this configuration, in a case where a sensor product is to be configured by combination of the A/D conversion circuit 1 and a sensor element, even when there is variation in nonlinearity of the sensor, the nonlinearity can be offset by dealing with the variation. For example, (the ratio r of) the amplification factors A1, A2 can be adjusted in such a procedure as follows.

When there is variation in nonlinearity of the sensor element among the sensor products each mounted with the A/D conversion circuit 1, the nonlinearity of each of the products is measured, to decide the resistance ratios of the variable resistors 15 to 18, namely the amplification factors A1, A2, which can offset the nonlinearity. Then, characteristic correction data corresponding to the amplification factors is written into a memory (e.g., EEPROM) in the sensor product. Note that such writing of the correction data is normally performed before shipment of the sensor product from a factory.

Further, the A/D conversion circuit 1 with such a configuration can change the nonlinearity even after the A/D conversion circuit 1 is combined with the sensor element. Thus, even when the characteristic concerning the nonlinearity of the sensor element to be combined is unclear, or even when a variety of kinds of sensor elements may be combined, the nonlinearity of the combined sensor element can be reliably offset (corrected).

The latch/encoders 37, 39 are provided in the systems A, B and detect, as position data, movement quantities less than one circulation of the pulse signals circulated in the first and second pulse circulation circuits 31, 32, and the detected data is used as the low-order bits of the A/D conversion data. Accordingly, still higher resolution can be obtained in accordance with the number of inverting circuits constituting the pulse circulation circuits 31, 32. Note that the latch/encoders 37, 39 may be provided according to the need.

Since the A/D conversion circuit 1 of the present embodiment offsets the temperature characteristic through use of the uniform characteristics of the pulse circulation circuits 31 to 34 of the four systems, it is preferable to design the element layout of the semiconductor integrated circuit device in consideration of the following respects.

(1) The pulse circulation circuits 31 to 34 of the four systems are disposed close to each other on the same semiconductor chip. With this placement, the temperatures of the inverting circuits Na to Nx become equal, and the temperature characteristic is offset.

(2) The pulse circulation circuits 31 to 34 of the four systems are disposed having the same shape and size. With this placement, the characteristics of the inverting circuits Na to Nx become equal, and the temperature characteristic is favorably offset.

(3) The pulse circulation circuits 31 to 34 of the four systems are disposed in the same direction. With this placement, execution in the semiconductor process becomes equal, and the temperature characteristic is favorably offset.

(4) The sizes of the pulse circulation circuits 31 to 34 of the four systems are made as large as possible. Accordingly, variation in size in the semiconductor process becomes relatively small, and the temperature characteristic is favorably offset.

(5) Peripheral circuits of the first and second counters 42, 43, the comparator 44 and the like are disposed near the pulse circulation circuits 31 to 34 on the same chip. With this placement, a parasitic capacitance accompanied by wiring can be reduced, to avoid erroneous operation based on a signal delay.

In the configuration of the present embodiment, the signal ratio change circuit 2 is configured using the full-differential amplifier circuits 11 to 14 and the variable resistors 15 to 18. Hence the amplification factor A1 of the full-differential amplifier circuits 11, 13 and the amplification factor A2 of the full-differential amplifier circuits 12, 14 can be individually set, and the ratio of these amplification factors: A2/A1=ratio r, can be arbitrarily set.

Second Embodiment

Hereinafter, a second embodiment of the present disclosure is described with reference to FIGS. 12 to 14.

Figure 12:
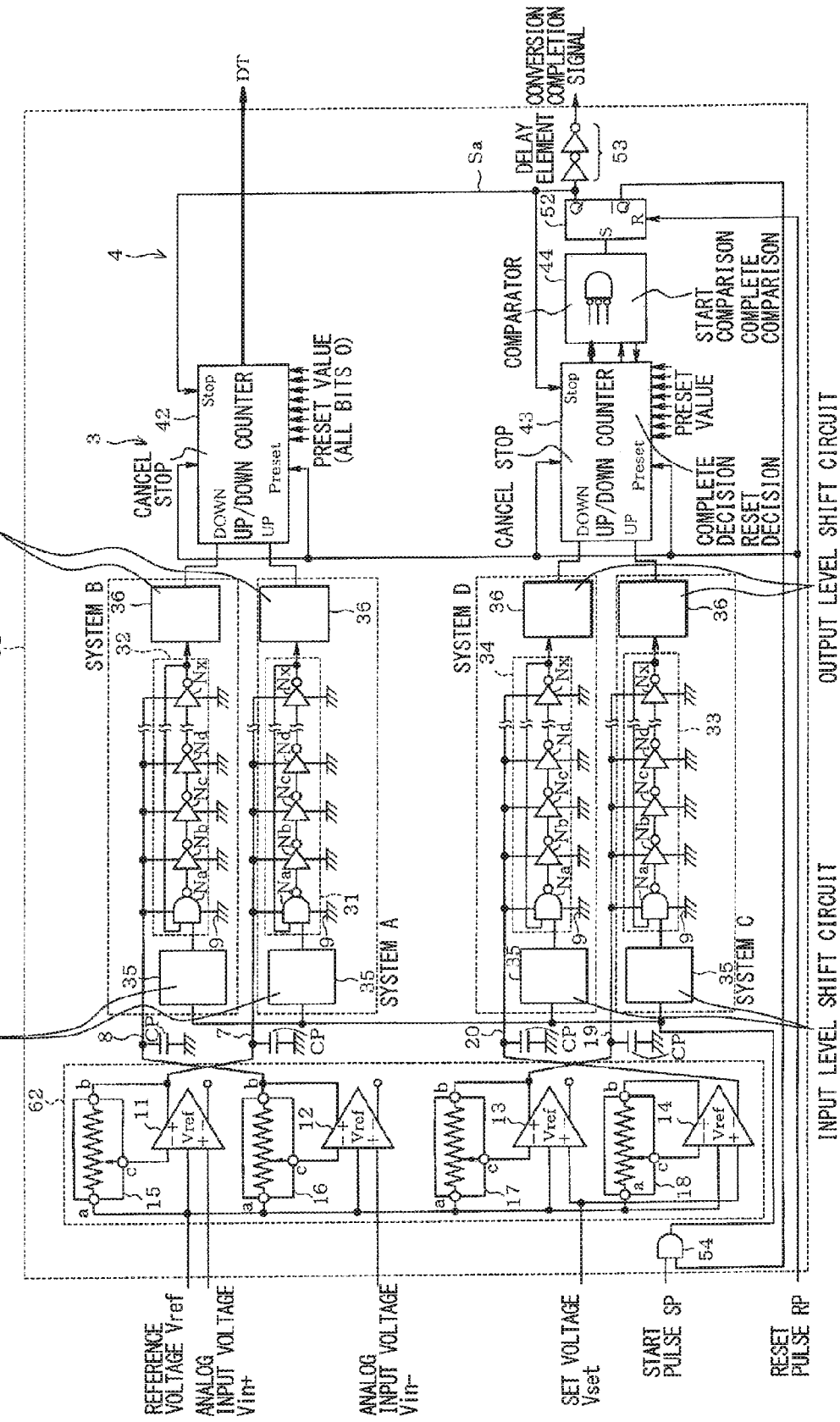
FIG. 12 is a diagram showing one specific configuration example of an A/D conversion circuit in a second embodiment.

An A/D conversion circuit 61 of the present embodiment shown in FIG. 12 is different from the A/D conversion circuit 1 of the first embodiment in that the voltage to be converted is in a differential form and in some other point. That is, the A/D conversion circuit 61 converts analog input voltages Vin+, Vin− (voltage to be converted) in the differential form to a digital value in accordance with a difference from the reference voltage Vref, and outputs the converted value as A/D conversion data DT. In this case, the latch/encoders 37, 39 are not provided (may be provided).

A signal ratio change circuit 62 included in the A/D conversion circuit 61 is different from the signal ratio change circuit 2 shown in FIG. 2 in the following respect. The analog input voltage Vin+ is supplied to the non-inverted input terminal of the full-differential amplifier circuit 11, and the analog input voltage Vin− is supplied to the non-inverted input terminal of the full-differential amplifier circuit 12. The inverted output terminal of the full-differential amplifier circuit 12 is in a non-connected state. The non-inverted output terminal of the full-differential amplifier circuit 12 is connected to the terminal b of the variable resistor 16 and also connected to the power source line 8.

The A/D conversion circuit 61 with such a configuration can be combined with a pressure sensor using the piezoresistance effect (cf. JP-H10-160602-A, etc.). FIG. 13 shows one configuration example of such a pressure sensor. In the pressure sensor 63 (corresponding to the sensor) shown in FIG. 13, a Wheatstone bridge is configured of semiconductor diffused resistors 64a to 64d. A terminal P61 is a power source terminal, a terminal P62 is an output terminal of a voltage Vp, and a terminal P63 is an output terminal of Vm.

Figure 13:
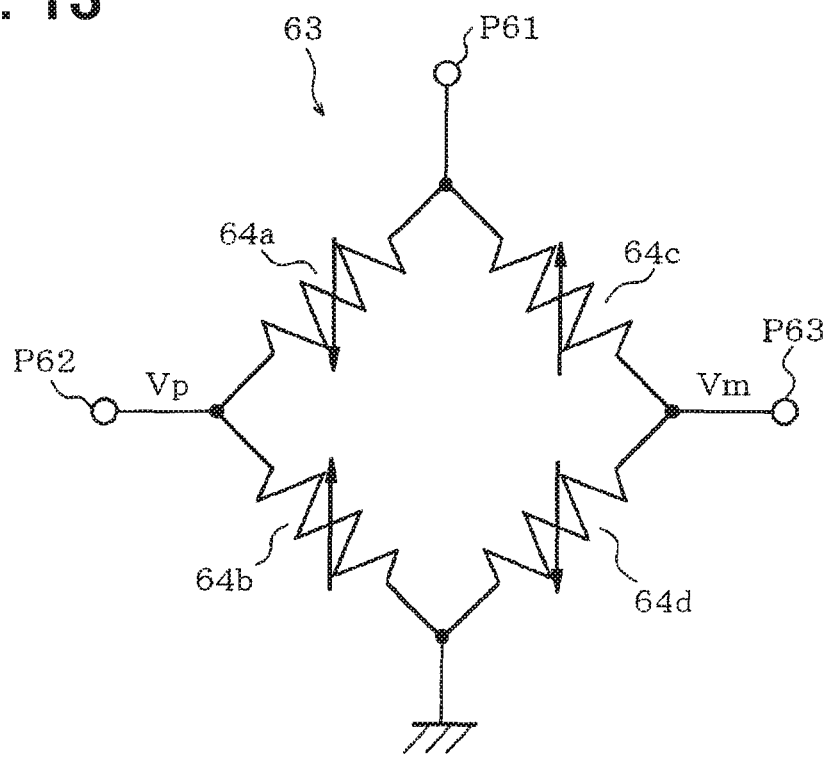
FIG. 13 is a diagram showing one configuration example of a pressure sensor using a piezo-resistance effect.
Figure 14:
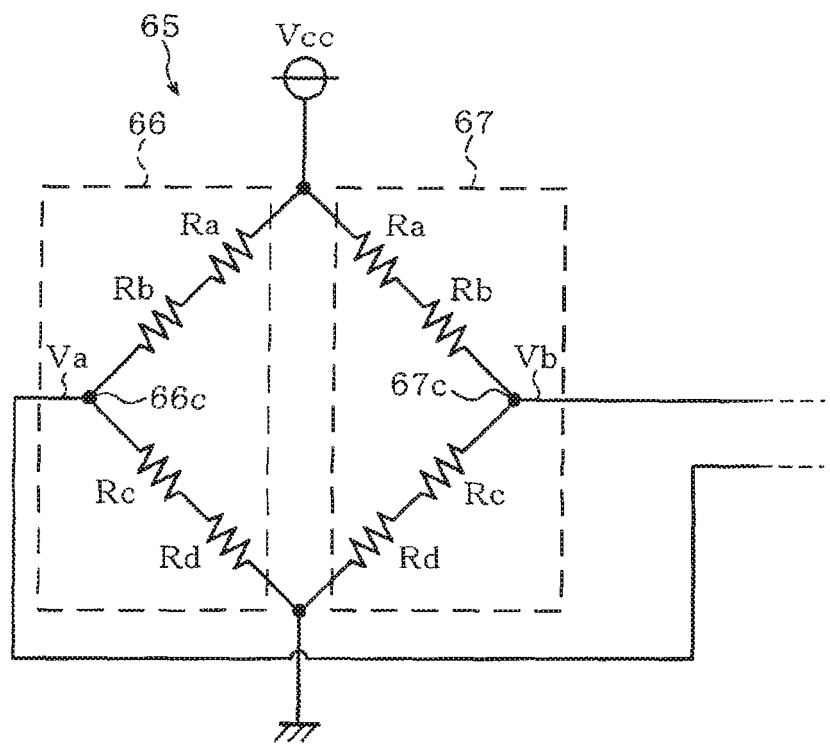
FIG. 14 is a diagram showing one configuration example of a current sensor using magneto resistive elements.

In FIG. 13, an arrow indicates an increase or a decrease of resistance. When the resistance increases at the time of pressure rise, it is indicated by an upward arrow, and when the resistance decreases, it is indicated by a downward arrow. Therefore, with the increase in pressure, the voltage Vp of the terminal P62 increases and the voltage Vm of the terminal P63 decreases. The output voltage of the pressure sensor 63 is a difference (=Vp−Vm) between the voltage Vp and the voltage Vm. When the pressure sensor 63 as thus described and the A/D conversion circuit 61 are combined, the voltage Vp is the analog input voltage Vin+, and the voltage Vm is the analog input voltage Vin−.

Many of pressure sensors with such a configuration normally have nonlinearity of about 0% to +0.4%, namely the convex nonlinearity. Note that the nonlinearity referred to here is defined by Formula (10) described above. Thus, when the A/D conversion circuit 61 is combined with the pressure sensor using the piezo-resistance effect, the ratio r of the amplification factors may be set such that the A/D conversion circuit 61 has the concave nonlinearity.

Further, the A/D conversion circuit 61 with the above configuration can be combined with a current sensor using a magneto resistive element, a magnetic sensor (cf. JP-2008-122083-A, JP-2011-242270-A, etc.), or the like. FIG. 14 shows one configuration example of such a current sensor. In a current sensor 65 (corresponding to the sensor) shown in FIG. 14, a Wheatstone bridge is configured of magneto resistive elements (MREs) 66, 67 as magnetic sensing elements. The magneto resistive elements 66, 67 are configured each including a half bridge circuit that connects magnetic resistors Ra to Rd in series. When the current sensor 65 as thus described and the A/D conversion circuit 61 are combined, voltages Va, Vb of middle points 66c, 67c on the respective half bridge circuits are the analog input voltages Vin+, Vin−.

In the case of the current sensor using the magneto resistive elements as thus described, the sensor has the nonlinearity since output of the sensor is in a sine wave form. Specifically, when the sensor is used with an equivalent sine wave of 0° to 15°, the nonlinearity of the sensor is about +0.44% (convex). Thus, in this case, the ratio r of the amplification factors may be set such that the A/D conversion circuit 61 has the concave nonlinearity. Further, when the sensor is used with an equivalent sine wave of −15° to 0°, the nonlinearity of the sensor is about −0.44% (concave). Thus, in this case, the ratio r of the amplification factors may be set such that the A/D conversion circuit 61 has the convex nonlinearity.

When such a current sensor and the A/D conversion circuit 61 are combined, it is possible to determine a current polarity and switch the nonlinearity (switch to the convex or concave). Further, the A/D conversion circuit 61 can also be combined with a sensor using a GMR element (Giant Magneto Resistive effect) that is a magnetic sensing element with a larger resistance change than the MRE (Magneto Resistive Effect).

Third Embodiment

Hereinafter, a third embodiment of the present disclosure is described with reference to FIG. 15.

Figure 15:
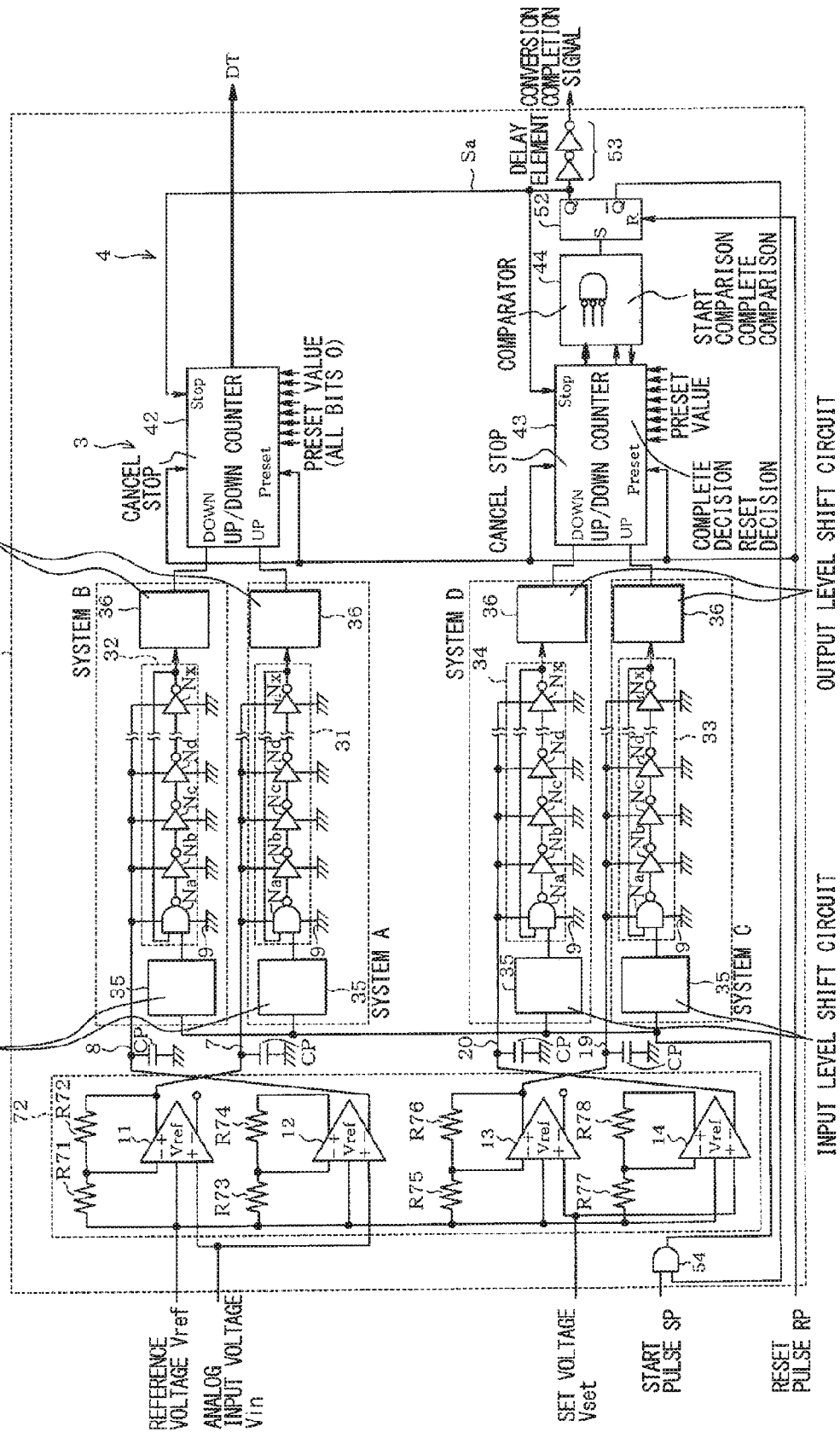
FIG. 15 is a diagram showing one specific configuration example of an A/D conversion circuit in a third embodiment.

As shown in FIG. 15, a signal ratio change circuit 72 in an A/D conversion circuit 71 of the present embodiment is different from the signal ratio change circuit 2 of the first embodiment in that resistors R71 to R78 are provided in place of the variable resistors 15 to 18 shown in FIG. 2. The resistors R71, R72 and the full-differential amplifier circuit 11 are connected in such a form as follows. One terminal of the resistor R71 is supplied with the reference voltage Vref. The other terminal of the resistor R71 is connected to the inverted input terminal of the full-differential amplifier circuit 11, and is also connected to the non-inverted output terminal of the full-differential amplifier circuit 11 via the resistor R72. Connection of the resistors R73, R74 and the full-differential amplifier circuit 12, connection of the resistors R75, R76 and the full-differential amplifier circuit 13, and connection of the resistors R77, R78 and the full-differential amplifier circuit 14 are made in a similar form to the connection of the resistors R71, R72 and the full-differential amplifier circuit 11.

In this case, the resistors R71, R75 have the same resistance value R1, the resistors R72, R76 have the same resistance value R2, the resistors R73, R77 have the same resistance value R3, and the resistors R74, R78 have the same resistance value R4. Therefore, the amplification factor A1 of the full-differential amplifier circuits 11, 13 is a fixed value that is settled by the resistance values R1, R2, and the amplification factor A2 of the full-differential amplifier circuits 12, 14 is a fixed value that is settled by the resistance values R3, R4.

As thus described, in the A/D conversion circuit 71 of the present embodiment, the ratio r of the amplification factors A1, A2, namely the nonlinearity, is fixed. Also with such a configuration, when the characteristic concerning the nonlinearity of the sensor element to be combined is known to some extent and it does not make a large change (there is no large variation in nonlinearity), by previously setting the nonlinearity of the A/D conversion circuit 71 in accordance with the characteristic of the sensor element, it is possible to offset the nonlinearity of the sensor element in a good manner. Furthermore, compared with the A/D conversion circuit 1 using the variable resistors 15 to 18, the A/D conversion circuit 71 using the resistors R71 to R78 has such advantages as simplification of the configuration and reduction in manufacturing cost.

Fourth Embodiment

Hereinafter, a fourth embodiment of the present disclosure is described with reference to FIG. 16.

Figure 16:
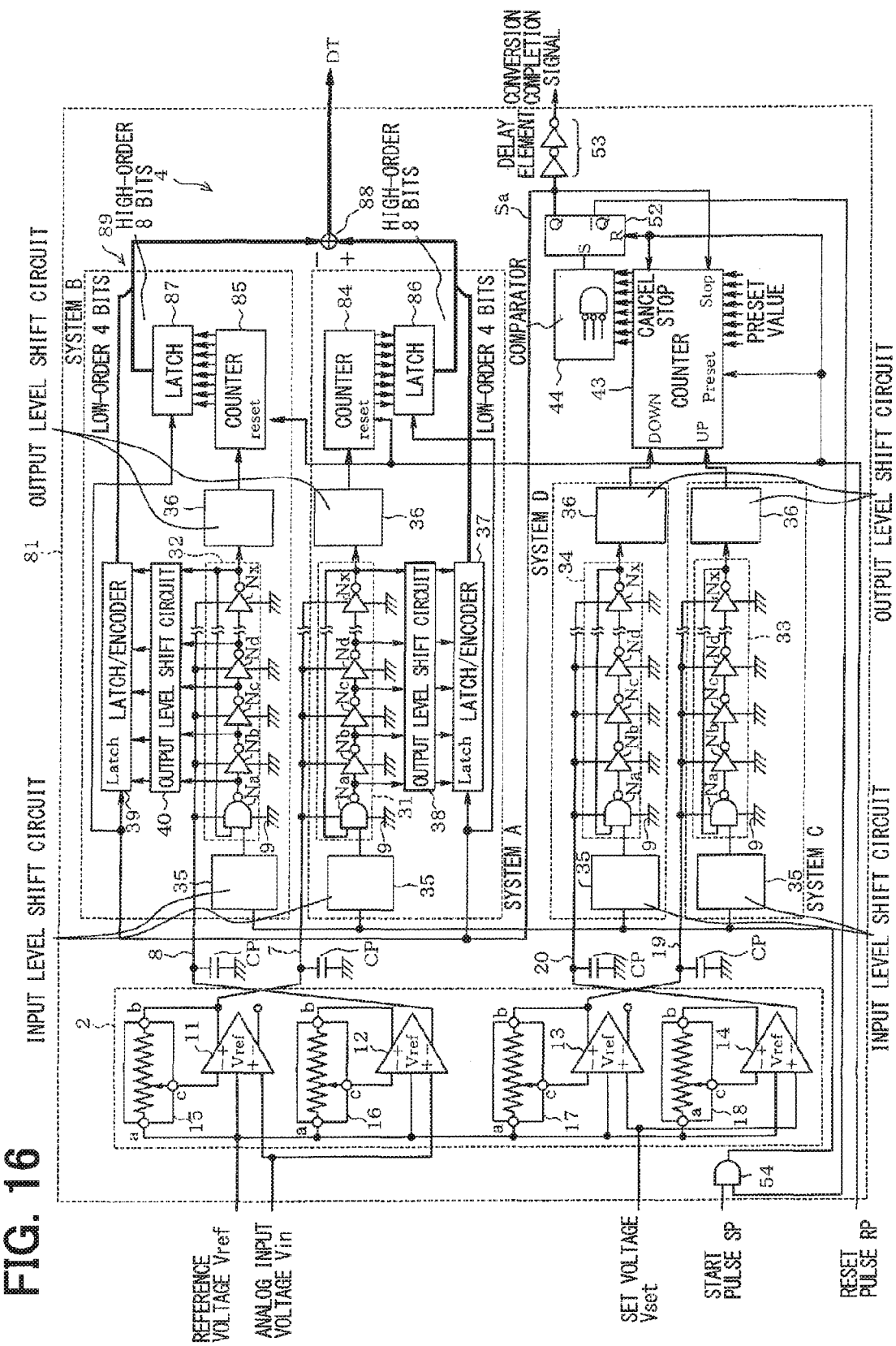
FIG. 16 is a diagram showing one specific configuration example of an A/D conversion circuit in a fourth embodiment.

As shown in FIG. 16, an A/D conversion circuit 81 of the present embodiment is different from the A/D conversion circuit 1 of the first embodiment in a specific configuration of the circulation number difference measurement section 3. In place of the first counter 42 of the systems A, B shown in FIG. 2, the A/D conversion circuit 81 includes counters 84, 85 with respect to the first and second pulse circulation circuits 31, 32, respectively, and those counters are provided for obtaining a count-up value and a count-down value. A latch 86 is provided so as to keep the counter value of the counter 84, and a latch 87 is provided so as to keep the counter value of the counter 85, whereby the counters 84, 85 and the latches 86, 87 are provided in two pairs. The paired counters 84, 85 are accompanied by the latches 86, 87 and a subtractor 88, to form an 8-bit up/down counter 89 of a second kind. When receiving input of the reset pulse RP, the counters 84, 85 reset the counted values to 0 and perform count-up respectively by output signals of the first pulse circulation circuit 31 and the second pulse circulation circuit 32.

Output values of the counters 84, 85 are kept in the latches 86, 87 by the conversion data output processing signal Sa of an H level. The circulation number data kept in the latches 86, 87 become high-order 8 bits, and the position data outputted from the latch/encoders 37, 39 become low-order 4 bits. The subtractor 88 subtracts the circulation number data and the position data of the system B from the circulation number data and the position data of the system A to obtain the 12-bit A/D conversion data DT. The latch/encoders 37, 39 may be provided according to the need.

The systems C, D of the A/D conversion circuit 81 shown in FIG. 16 have the same configurations as those shown in FIG. 2. However, in FIG. 16, the decision completion signal (comparison start signal) and the decision cancel signal (comparison completion signal) between the second counter 43 and the comparator 44 are omitted.

According to the present embodiment, general-purpose up-counters 84, 85 can be used. In the A/D conversion circuit 81 with the general-purpose up-counters 84, 85 employed to the systems A, B, subtraction by the subtractor 88 may be performed just once at the completion of the conversion. Since the A/D conversion circuit 81 can thus perform subtraction processing after the next A/D conversion is started, it is possible to obtain highly accurate A/D conversion data while using the general-purpose up-counters 84, 85.

Fifth Embodiment

Hereinafter, a fifth embodiment of the present disclosure is described with reference to FIG. 17.

Figure 17:
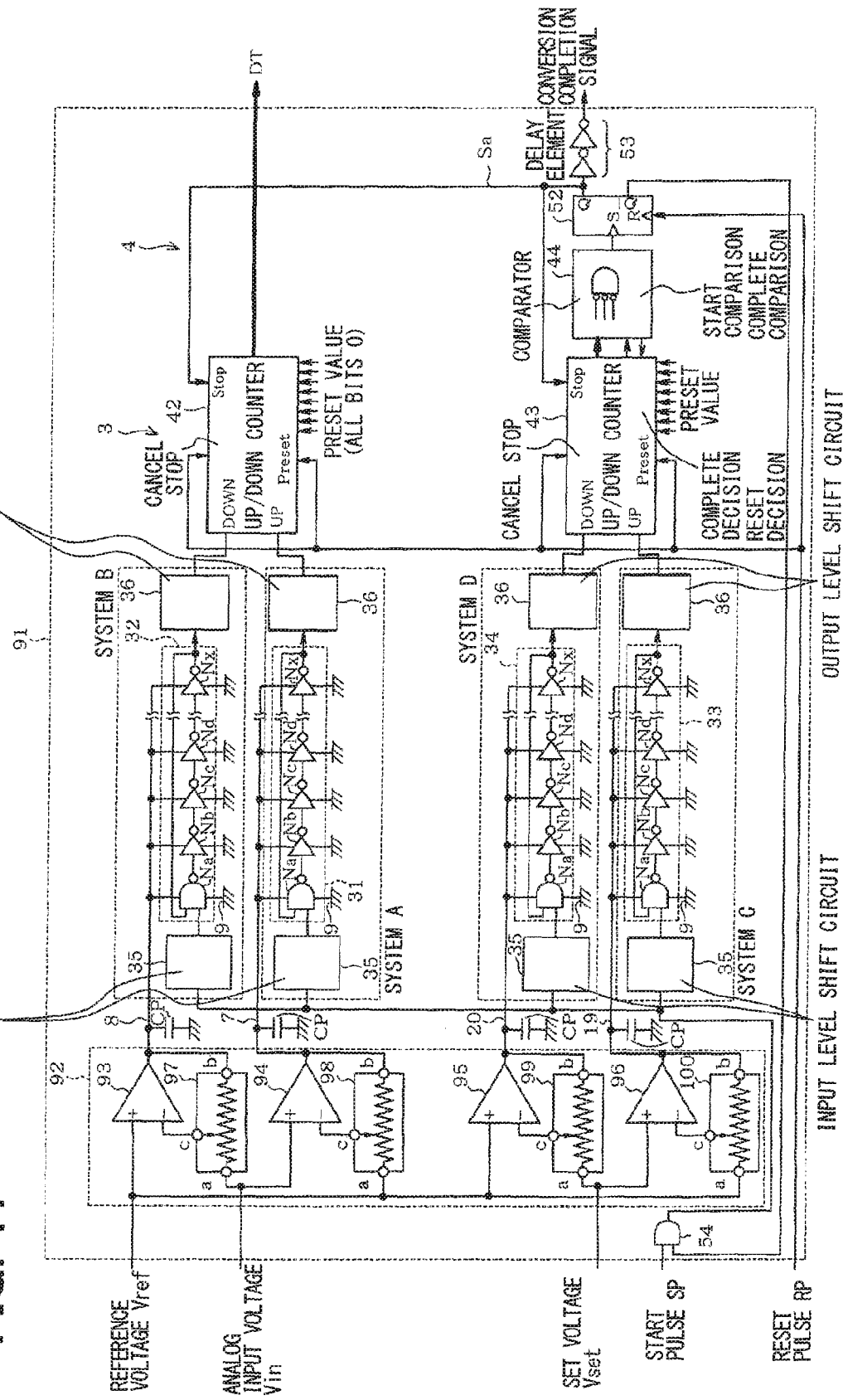
FIG. 17 is a diagram showing one specific configuration example of an A/D conversion circuit in a fifth embodiment.

An A/D conversion circuit 91 of the present embodiment shown in FIG. 17 is different from the A/D conversion circuit 1 of the first embodiment in that a signal ratio change circuit 92 is provided in place of the signal ratio change circuit 2 shown in FIG. 2, and in some other point. In this case, the latch/encoders 37, 39 are not provided (may be provided).

The signal ratio change circuit 92 includes OP amplifiers 93 to 96 and variable resistors 97 to 100. A non-inverted input terminal of the OP amplifier 93 is supplied with the reference voltage Vref. An inverted input terminal of the OP amplifier 93 is connected to a common terminal c of the variable resistor 97. An output terminal of the OP amplifier 93 is connected to the power source line 8 and also connected to a terminal b of the variable resistor 97. A terminal a of the variable resistor 97 is supplied with the analog input voltage Vin.

A non-inverted input terminal of the OP amplifier 94 is supplied with the analog input voltage Vin. An inverted input terminal of the OP amplifier 94 is connected to a common terminal c of the variable resistor 98. An output terminal of the OP amplifier 94 is connected to the power source line 7 and also connected to a terminal b of the variable resistor 98. A terminal a of the variable resistor 98 is supplied with the reference voltage Vref.

A non-inverted input terminal of the OP amplifier 95 is supplied with the reference voltage Vref. An inverted input terminal of the OP amplifier 95 is connected to a common terminal c of the variable resistor 99. An output terminal of the OP amplifier 95 is connected to the power source line 20 and also connected to a terminal b of the variable resistor 99. A terminal a of the variable resistor 99 is supplied with the setting voltage Vset.

A non-inverted input terminal of the OP amplifier 96 is supplied with the setting voltage Vset. An inverted input terminal of the OP amplifier 96 is connected to a common terminal c of the variable resistor 100. An output terminal of the OP amplifier 96 is connected to the power source line 19 and also connected to a terminal b of the variable resistor 100. A terminal a of the variable resistor 100 is supplied with the reference voltage Vref.

Similarly to the variable resistors 15 to 18, the variable resistors 97 to 100 are configured such that a ratio of resistance between the terminals a and c and resistance between the terminals b and c can be changed while resistance between the terminals a and b is fixed. The ratios of the resistance of the variable resistors 97, 99 are the same, and change in conjunction with each other. Further, the ratios of the resistance of the variable resistors 98, 100 are the same, and change in conjunction with each other.

With the above configuration, the OP amplifier 93 is operated as an inverted amplifying circuit. The amplification factor A2 in this case can be expressed by Formula (11) below. Here, R1 is a resistance value between terminals a and c of the variable resistor 97, and R2 is a resistance value between the terminals b and c of the variable resistor 97.

$$A2 = R2/R1 \qquad (11)$$

Then, the output voltage of the OP amplifier 93 can be expressed by Formula (12) below. Here, $\Delta V$ is a differential voltage obtained by subtracting the reference voltage Vref from the analog input voltage Vin.

$$\text{Output voltage of } OP \text{ amplifier } 93 = V\text{ref} - A2 \cdot \Delta V \qquad (12)$$

Further, the OP amplifier 94 is operated as a non-inverted amplifying circuit. The amplification factor A1 in this case can be expressed by Formula (13) below. Here, R3 is a resistance value between terminals a and c of the variable resistor 98, and R4 is a resistance value between the terminals b and c of the variable resistor 98.

$$A1 = 1 + (R4/R3) \qquad (13)$$

Then, the output voltage of the OP amplifier 94 can be expressed by Formula (14) below.

$$\text{Output voltage of } OP \text{ amplifier } 94 = V\text{ref} + A1 \cdot \Delta V \qquad (14)$$

Hence the output terminal of the OP amplifier 93 corresponds to a second output terminal of the signal ratio change circuit 92, and the output terminal of the OP amplifier 94 corresponds to a first output terminal of the signal ratio change circuit 92. Note that output voltages of the OP amplifiers 95, 96 can also be expressed by Formulas (12), (14) above. In this case, ΔV is a differential voltage obtained by subtracting the reference voltage Vref from the setting voltage Vset. Further, in the present embodiment, the variable resistors 97, 98 correspond to the signal ratio adjustment device.

As thus described, also according to the present embodiment where the signal ratio change circuit 92 is configured using the normal OP amplifiers 93 to 96, the applied voltages to the respective delay units of the systems A, B have mutually different absolute values. Then, the balance of the absolute values of the applied voltages to the systems A, B can be arbitrarily set by the ratio r of the amplification factors A1, A2 of the OP amplifiers 93, 94, That is, similarly to the A/D conversion circuit 1 of the first embodiment, the A/D conversion circuit 91 is configured so as to be able to arbitrarily change the nonlinearity. Thus, also according to the present embodiment, a similar function and effect to those of the first embodiment can be obtained.

Sixth Embodiment

Hereinafter, a sixth embodiment of the present disclosure is described with reference to FIG. 18.

Figure 18:
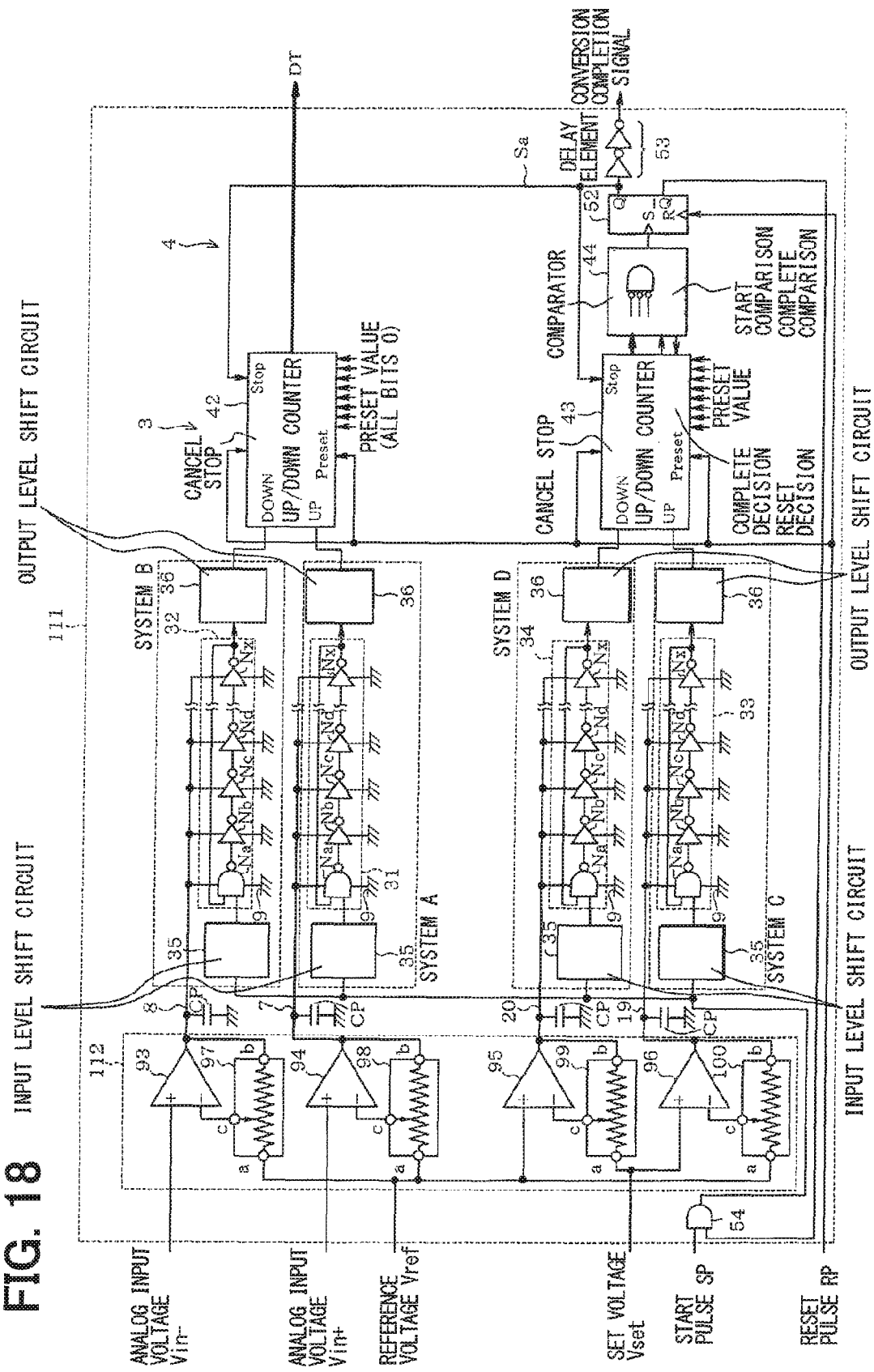
FIG. 18 is a diagram showing one specific configuration example of an A/D conversion circuit in a sixth embodiment.

An A/D conversion circuit 111 of the present embodiment shown in FIG. 18 is different from the A/D conversion circuit 91 of the fifth embodiment in that the voltage to be converted is in a differential form and in some other point. That is, the A/D conversion circuit 111 converts analog input voltages Vin+, Vin− (voltage to be converted) in the differential form to a digital value in accordance with a difference from the reference voltage Vref, and outputs the converted value as A/D conversion data DT. In this case, the latch/encoders 37, 39 are not provided (may be provided).

A signal ratio change circuit 112 included in the A/D conversion circuit 111 is different from the signal ratio change circuit 92 in the following respect. The analog input voltage Vin+ is supplied to the non-inverted input terminal of the OP amplifier 94, and the analog input voltage Vin− is supplied to the non-inverted input terminal of the OP amplifier 93. A terminal a of each of the variable resistors 97, 98 is supplied with the reference voltage Vref. With such a configuration, both the OP amplifiers 93, 94 are operated as non-inverted amplifying circuits. Since the OP amplifier 93 is operated as the non-inverted amplifying circuit, the amplification factor A2 thereof is as in Formula (15) below.

$$A2=1+(R2/R1) \quad (15)$$

The A/D conversion circuit 111 with such a configuration can also be combined with the pressure sensor using the piezo-resistance effect, the current sensor using the magneto resistive element, the magnetic sensor, or the like, similarly to the A/D conversion circuit 61 of the second embodiment.

Seventh Embodiment

Hereinafter, a seventh embodiment of the present disclosure is described with reference to FIG. 19.

Figure 19:
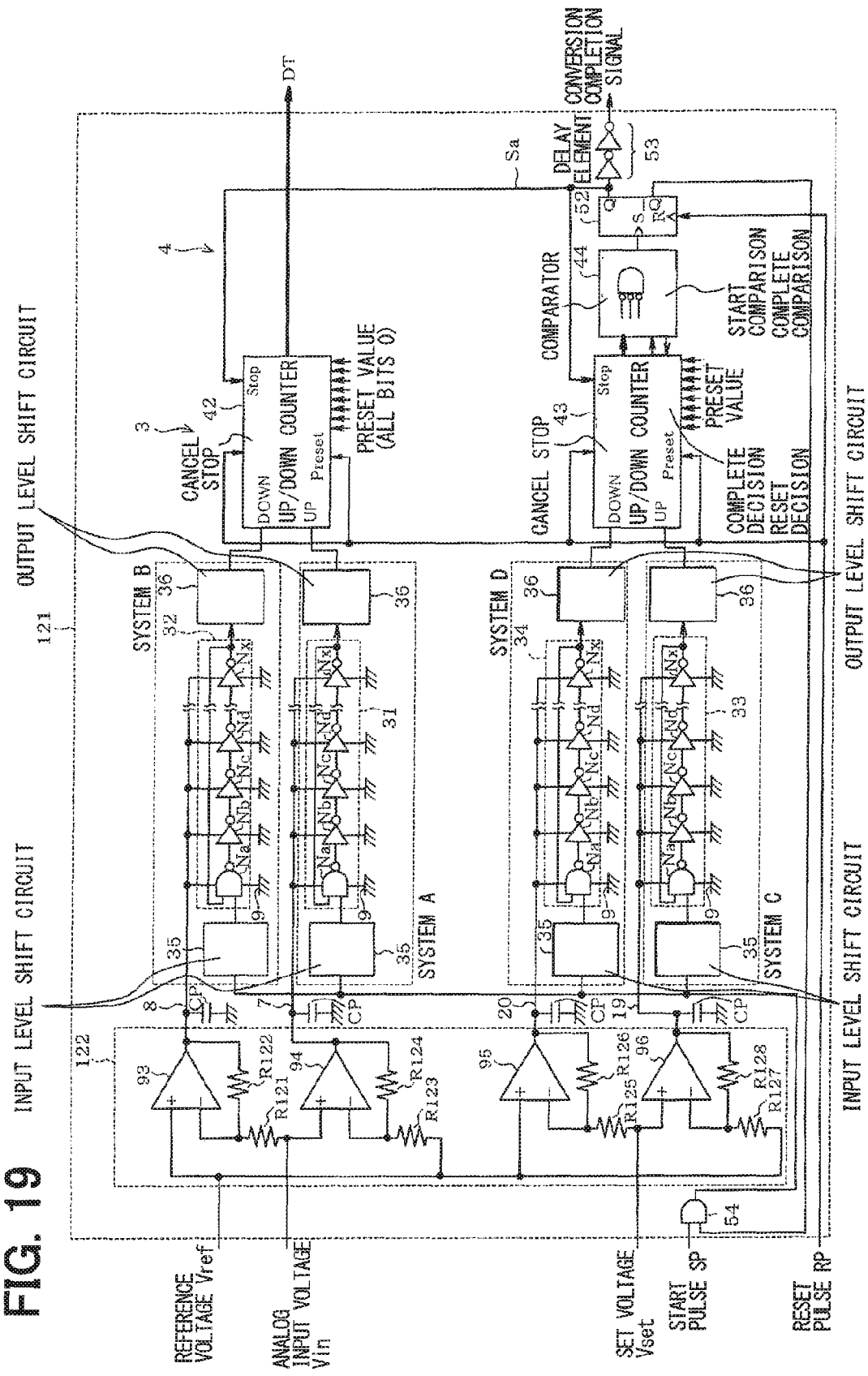
FIG. 19 is a diagram showing one specific configuration example of an A/D conversion circuit in a seventh embodiment.

As shown in FIG. 19, a signal ratio change circuit 122 in an A/D conversion circuit 121 of the present embodiment is different from the signal ratio change circuit 92 of the fifth embodiment in that resistors R121 to R128 are provided in place of the variable resistors 97 to 100. The resistors R121, R122 and the OP amplifier 93 are connected in such a form as follows. One terminal of the resistor R121 is supplied with the analog input voltage Vin. The other terminal of the resistor R121 is connected to the inverted input terminal of the OP amplifier 93, and is also connected to the output terminal of the OP amplifier 93 via the resistor R122.

The resistors R123, R124 and the OP amplifier 94 are connected in such a form as follows. One terminal of the resistor R123 is supplied with the reference voltage Vref. The other terminal of the resistor R123 is connected to the inverted input terminal of the OP amplifier 94, and is also connected to the output terminal of the OP amplifier 94 via the resistor R124.

The resistors R125, R126 and the OP amplifier 95 are connected in such a form as follows, One terminal of the resistor R125 is supplied with the setting voltage Vset. The other terminal of the resistor R125 is connected to the inverted input terminal of the OP amplifier 95, and is also connected to the output terminal of the OP amplifier 95 via the resistor R126. The resistors R127, R128 and the OP amplifier 96 are connected to the resistors R123, R124 and the OP amplifier 94.

In this case, the resistors R121, R125 have the same resistance value R1, the resistors R122, R126 have the same resistance value R2, the resistors R123, R127 have the same resistance value R3, and the resistors R124, R128 have the same resistance value R4. Therefore, the amplification factor A2 of the OP amplifiers 93, 95 is a fixed value that is settled by the resistance values R1, R2, and the amplification factor A1 of the OP amplifiers 94, 96 is a fixed value that is settled by the resistance values R3, R4.

As thus described, in the A/D conversion circuit 121 of the present embodiment, similarly to the A/D conversion circuit 71 of the third embodiment, the ratio r of the amplification factors A1, A2, namely the nonlinearity, is fixed. Thus, also according to the present embodiment, a similar function and effect to those of the third embodiment can be obtained.

Eighth Embodiment

Figure 20:
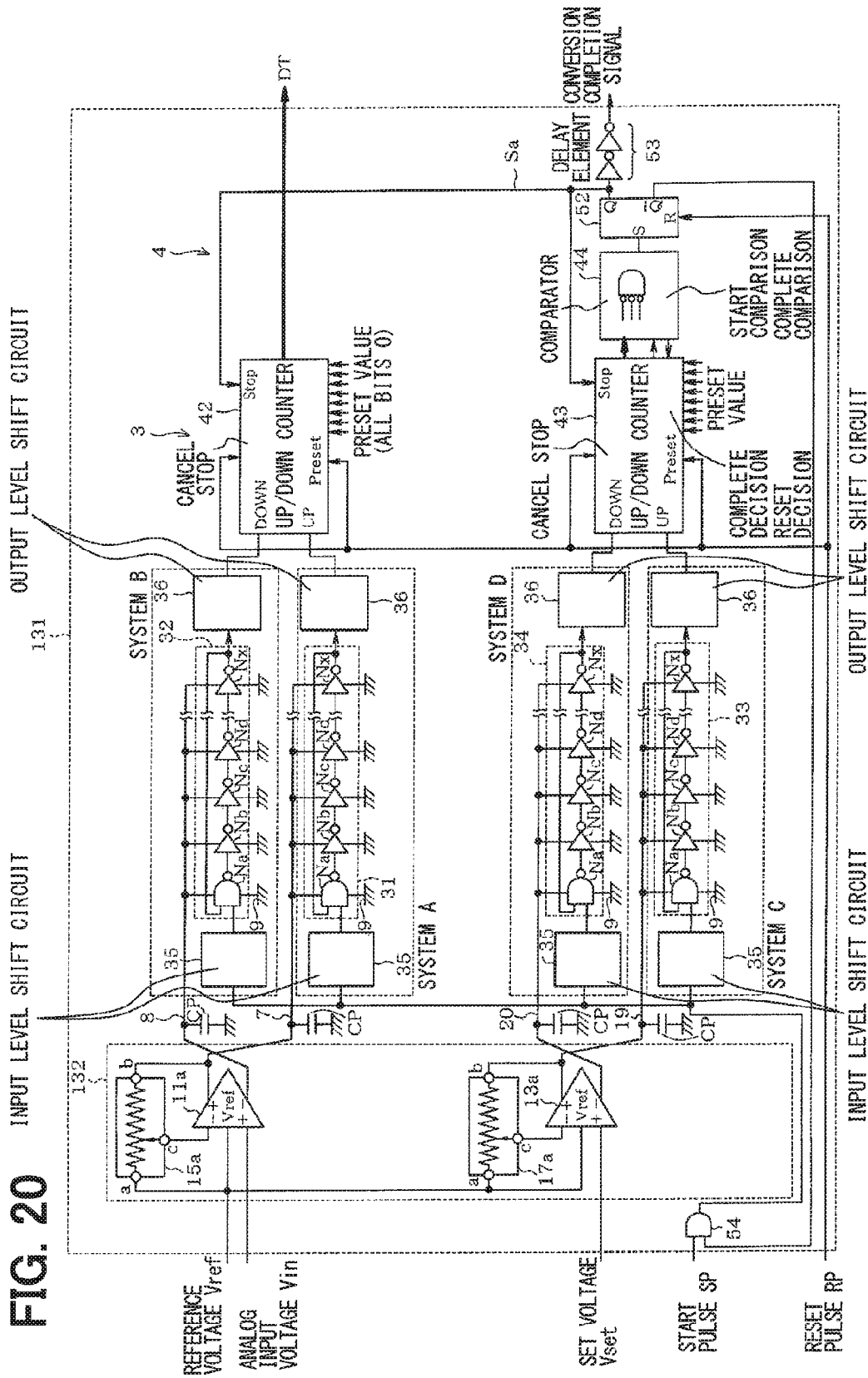
FIG. 20 is a diagram showing one specific configuration example of an A/D conversion circuit in an eighth embodiment.

Hereinafter, an eighth embodiment of the present disclosure is described with reference to FIGS. 20 to 23. An A/D conversion circuit 131 shown in FIG. 20 is different from the A/D conversion circuit 61 of the second embodiment mainly in that a full-differential amplifier circuit 11a is provided in place of the full-differential amplifier circuits 11, 12 and in that a full-differential amplifier circuit 13a is provided in place of the full-differential amplifier circuits 13, 14. Although the differential input is made in the second embodiment, single-end input is made in the present embodiment. Further, the latch/encoders 37, 39 are not provided (may be provided).

In addition to the configuration of any of the A/D conversion circuits described above and later, the A/D conversion circuit 131 shown in FIG. 20 generates and outputs a one-half cycle signal Sh (switch signal) that differentiates a first-half period and a last-half period of one A/D conversion period. This one-half cycle signal Sh is a signal provided for switching an analog switch in the full-differential amplifier circuit of FIG. 21.

The A/D conversion circuit 131 inputs an analog signal voltage Vs outputted from the sensor or the like, converts the analog signal voltage Vs as the analog input voltage Vin to a digital value in accordance with a difference between the analog input voltage Vin (voltage to be converted) and the reference voltage Vref, and outputs the digital value as the A/D conversion data DT.

As shown in FIG. 20, a signal ratio change circuit 132 includes the full-differential amplifier circuits 11a, 13a and variable resistors 15a, 17a. A non-inverted input terminal of the full-differential amplifier circuit 11a is supplied with the analog input voltage Vin. An inverted input terminal of the full-differential amplifier circuit 11a is connected to a common terminal c of the variable resistor 15a. The non-inverted output terminal of the full-differential amplifier circuit 11a is connected to the power source line 7, and is also connected to a terminal b of the variable resistor 15a. The inverted output terminal of the full-differential amplifier circuit 11a is connected to the power source line 8. A terminal a of the variable resistor 15a is supplied with the reference voltage Vref.

A non-inverted input terminal of the full-differential amplifier circuit 13a is supplied with the setting voltage Vset. An inverted input terminal of the full-differential amplifier circuit 13a is connected to a common terminal c of the variable resistor 17a. The non-inverted output terminal of the full-differential amplifier circuit 13a is connected to a power source line 19, and is also connected to a terminal b of the variable resistor 17a. The inverted output terminal of the full-differential amplifier circuit 13a is connected to the power source line 20. A terminal a of the variable resistor 17a is supplied with the reference voltage Vref. The variable resistors 15a, 17a are configured such that a ratio of resistance between the terminals a and c and resistance between the terminals b and c can be changed while resistance between the terminals a and b is fixed. The ratios of the resistance of the variable resistors 15a, 17a are the same, and change in conjunction with each other. Changing the ratios of resistance of the variable resistors 15a, 17a in conjunction with each other corresponds to changing the amplification factors of the full-differential amplifier circuit 11a and the full-differential amplifier circuit 13a in conjunction with each other. The variable resistors 15a, 17a can be configured of a plurality of resistors 21 using digital variable resistors (digital potential meters) as shown in FIG. 3, and the analog multiplexer 22 shown in FIG. 4.

Figure 21:
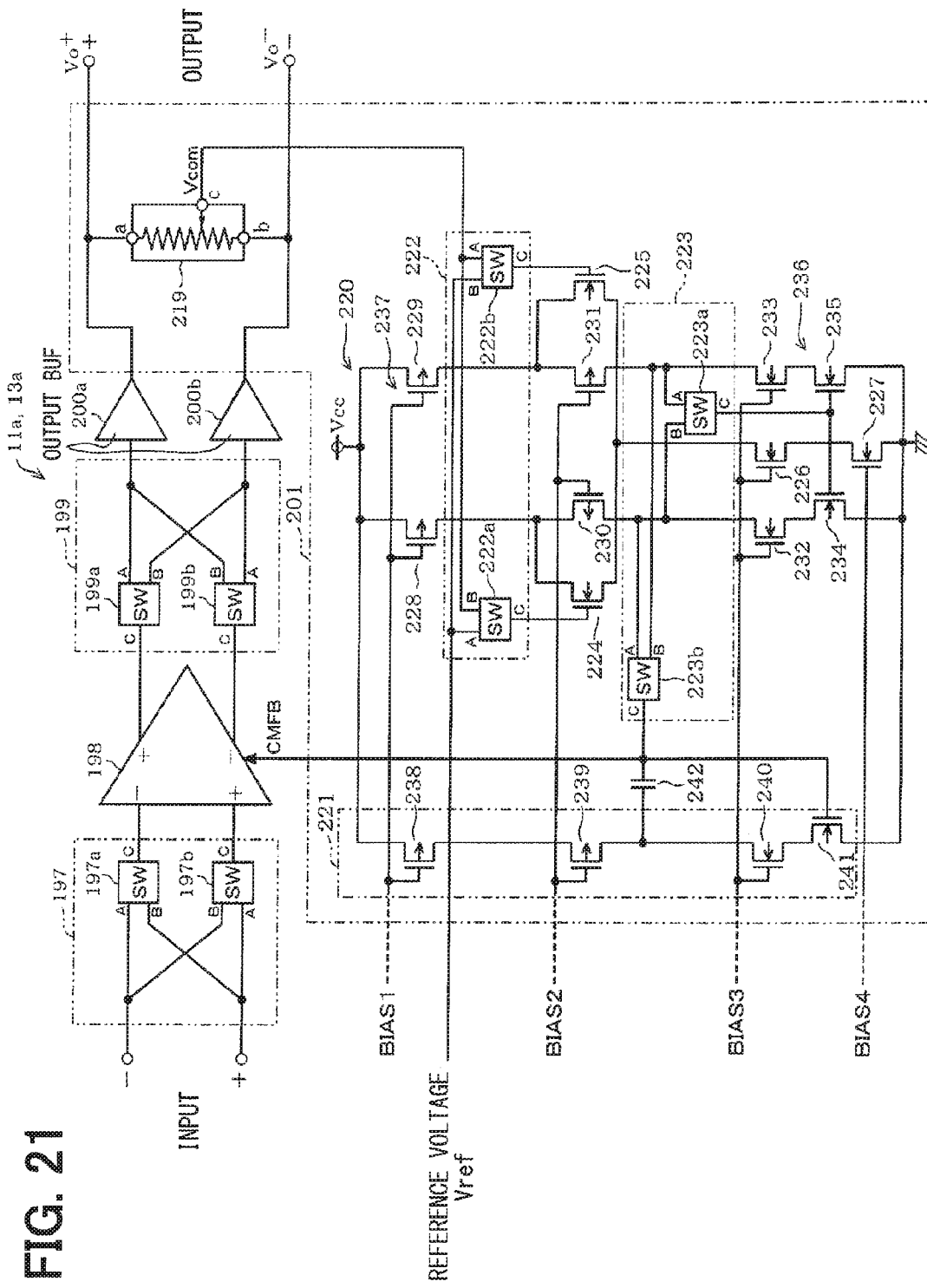
FIG. 21 is a diagram showing a configuration example of a full-differential amplifier circuit.

FIG. 21 shows configurations of the full-differential amplifier circuits 11a, 13a. The full-differential amplifier circuits 11a, 13a each include a first changeover circuit 197, a first differential pair circuit section 198, a second changeover circuit 199, first output circuit sections 200a, 200b, and a common mode feedback circuit 201.

Figure 23:
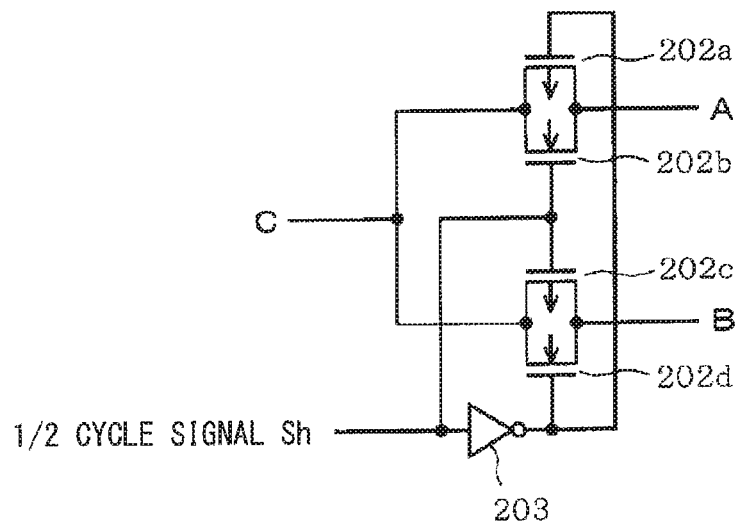
FIG. 23 is a diagram showing a circuit configuration example of an analog switch of FIG. 21.

Changeover switches 197a, 197b, 199a, 199b constituting the changeover circuits 197, 199 are made up of analog switches 202a to 202d as shown in FIG. 23, and allow passage of a current either between the terminals C and A or between the terminals C and B in accordance with the one-half cycle signal Sh and a signal obtained by inverting the signal Sh by an inverter 203. The first changeover circuit 197 exchanges two connection lines between the inverted input terminal/non-inverted input terminal of the full-differential amplifier circuit 11a or 13a and the inverted input terminal/non-inverted input terminal of the first differential pair circuit section 198. The second changeover circuit 199 exchanges two connection lines between the non-inverted output terminal/inverted input terminal of the first differential pair circuit section 198 and the input terminals of the first output circuit sections 200a, 200b.

Figure 22:
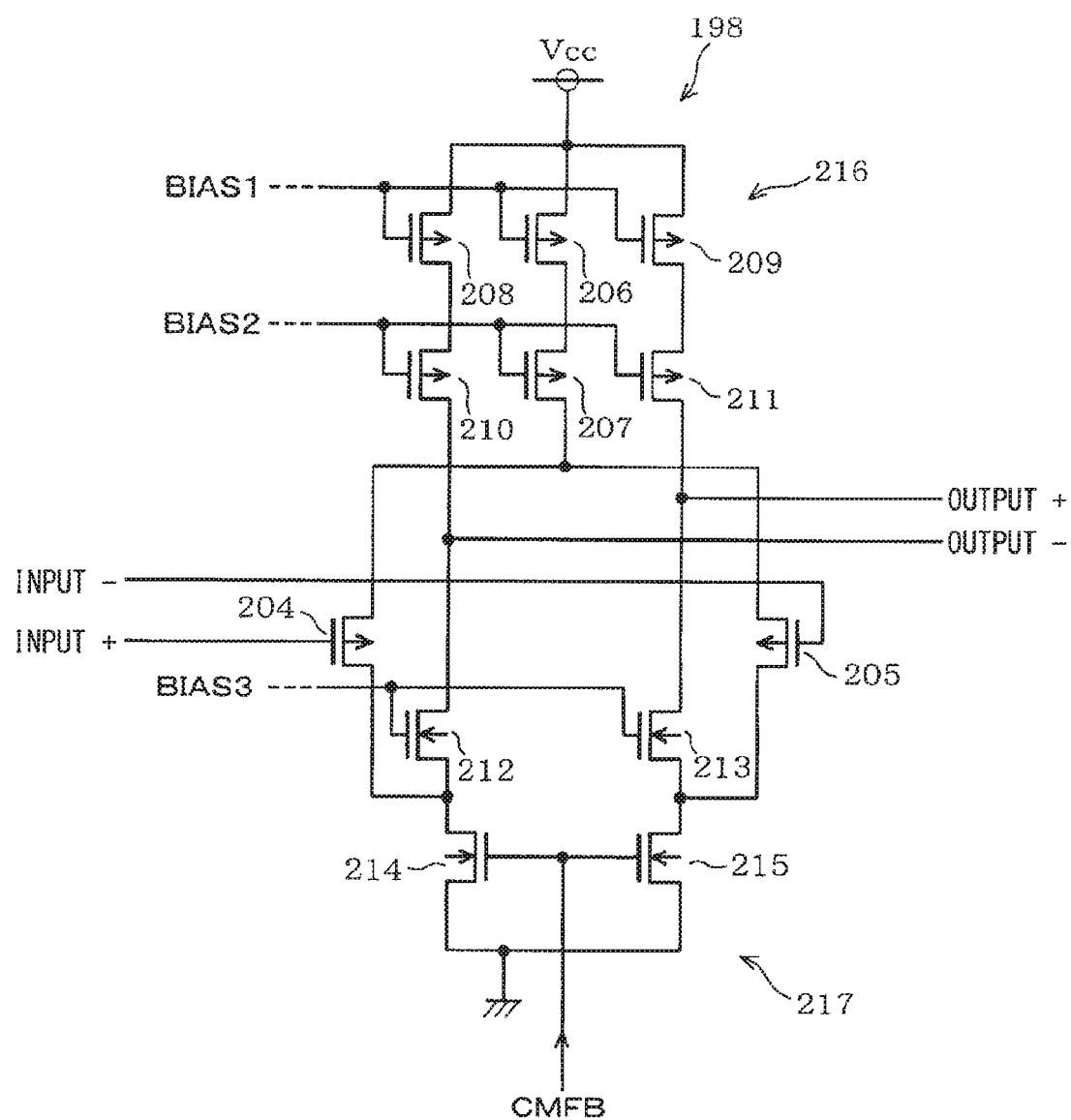
FIG. 22 is a diagram showing a configuration example of a first differential pair circuit section of FIG. 21.

The first differential pair circuit section 198 has the form of folded cascode connection as shown in FIG. 22, and is configured of transistors 204 to 215. The transistors 204, 205 constitute a differential pair, and the transistors 206, 207 which are operated as a constant current circuit are cascode-connected between a source of the differential pair and a Vcc power source line. The transistors 208, 209, the transistors 210, 211, the transistors 212, 213, and the transistors 214, 215, each being paired, are connected in series between the Vcc power source line and the ground line. The transistors 208, 210 and the transistors 209, 211 are respectively cascode-connected, to constitute an active load 216 with respect to the differential pair.

The transistors 214, 215 constitute a constant current circuit 217 for folding an output current of the differential pair and inputting the current into the active load 216, and a common gate line of the active load 216 receives input of a common mode feedback signal CMFB. Further, the transistors 212, 213 connected between the active load 216 and the constant current circuit 217 are provided so as to suppress generation of a mirror effect in the transistors 204, 205. Sources of these transistors 212, 213, (i.e., drains of the transistors 214, 215) are respectively connected to drains of the transistors 204, 205. The drains of the transistors 210, 211 are output terminals of the first differential pair circuit section 198.

The common mode feedback circuit 201 shown in FIG. 21 includes a common mode voltage detection section 219, a second differential pair circuit section 220, a second output circuit section 221, a fourth changeover circuit 222, and a fifth changeover circuit 223. Changeover switches 222a, 222b, 223a, 223b constituting the changeover circuits 222, 223 have the configuration shown in FIG. 23.

The common mode voltage detection section 219 is configured of a variable resistor 219 connected between output nodes of the first output circuit sections 200a, 200b, and receives input of output voltages Vo+, Vo− of the first output circuit sections 200a, 200b to detect a common mode voltage Vcom that is an intermediate voltage between the output voltages Vo+, Vo−. A terminal a of the variable resistor 219 is supplied with the output voltage Vo+ of the first output circuit section 200a. A terminal b of the variable resistor 219 is supplied with the output voltage Vo− of the first output circuit section 200b.

The variable resistor 219 of each of the full-differential amplifier circuits 11a, 13a is configured such that a ratio of resistance between the terminals a and c and resistance between the terminals b and c can be changed while resistance between the terminals a and b is fixed. The variable resistor 219 can be configured of a plurality of resistors 21 using digital variable resistors (digital potential meters) as shown in FIG. 3, and the analog multiplexer 22 shown in FIG. 4, for example.

The ratios of the resistance between the terminals of the variable resistors 219 in the full-differential amplifier circuits 11a, 13a are the same, and change in conjunction with each other. Further, in the full-differential amplifier circuits 11a, 13a, R13 is a resistance value between the terminals a and c, and R14 is a resistance value between the terminals c and b. Then, a ratio (R13/R14) is not set to 1, namely R13≠R14 is set. At this time, the common mode voltage Vcom can be expressed as shown in Formula (16).

$$Vcom=Vo-+R14/(R13+R14)\times(Vo+-Vo-) \qquad (16)$$

The second differential pair circuit section 220 has the form of the folded cascode connection similarly to the first differential pair circuit section 198, and is configured of transistors 224 to 235. The transistors 224, 225 constitute a differential pair, and the transistors 226, 227 constitute a constant current circuit. The transistors 232, 234 and the transistors 233, 235 constitute an active load 236 with respect to the differential pair. The transistors 228, 229 constitute a constant current circuit 237.

The second output circuit section 221 is configured of transistors 238 to 241 connected in series between the Vcc power source line and the ground line. Two output terminals of the second differential pair circuit section 220 are connected to a gate of the transistor 241 via a changeover switch 223b, and also connected to drains of transistors 239, 240 via the changeover switch 223b and a capacitor 242 for phase compensation. An output voltage of the second differential pair circuit section 220 selected by the changeover switch 223b is the above common mode feedback signal CMFB.

Figure 24:
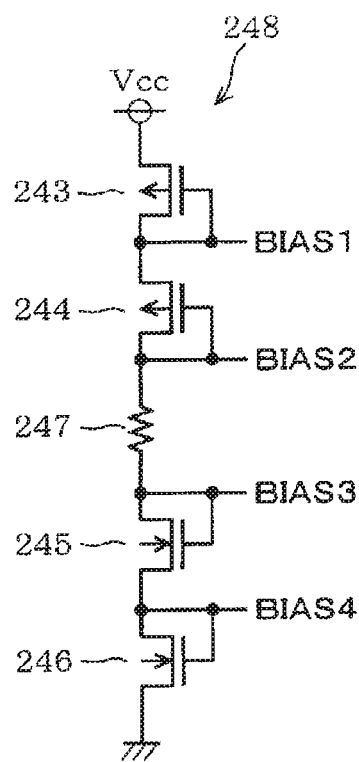
FIG. 24 is a diagram showing a configuration example of a bias generation circuit of FIG. 21.

The fourth changeover circuit 222 exchanges input lines of the reference voltage Vref and the common mode voltage Vcom into the second differential pair circuit section 220. The changeover switch 223b in the fifth changeover circuit 223 selects one of the output terminals of the second differential pair circuit section 220 and connects the selected output terminal to the second output circuit section 221. Meanwhile, the changeover switch 223a selects the other output terminal, which is not selected by the changeover switch 223b, and connects the other output terminal to gates of the transistors 234, 235. Note that four bias voltages 1 to 4 used in the full-differential amplifier circuit are generated by a bias voltage generation circuit 248 made up of transistors 243 to 246 and a resistor 247 as shown in FIG. 24.

A function of the above configuration is described. The circuit of the present embodiment is characterized in that the two output terminals (non-inverted output terminal, inverted output terminal) of each of the full-differential amplifier circuits 11a, 13a are effectively utilized while an offset is compensated. The full-differential amplifier circuits 11a, 13a apply common mode feedback being negative feedback such that the common mode voltage Vcom (i.e., a divided voltage of the output voltages Vo+, Vo−) is equal to the reference voltage Vref. In this case, when the one-half cycle signal Sh is at the H level, the analog switches 202a, 202b shown in FIG. 23 are on, while the analog switches 202c, 202d are off. When the one-half cycle signal Sh is at the L level, the analog switches 202a, 202b are off, while the analog switches 202c, 202d are on. That is, when the level of the one-half cycle signal Sh is inverted, the connection forms between the terminals in the changeover circuits 197, 199, 222, 223 are reversed, and hence the direction (positive/negative) of an offset voltage ΔV is reversed. Since the A/D conversion circuit 131 has obtained the A/D conversion data with respect to the average value of the analog input voltage Vin and the average value of the setting voltage Vset during the A/D conversion period, it is possible to obtain highly accurate A/D conversion data with the offset voltage of the OP amplifier canceled by inverting the direction of the offset voltage by the changeover circuits 197, 199, 222, 223.

Further, as shown in FIG. 21, the A/D conversion circuit 131 is operated such that the common mode voltage Vcom is consistent with the reference voltage Vref, to give: Vref=Vcom. Definition is made as in Formulas (17) and (18) below where Vo+ is an output voltage of a first output terminal (+) of each of the full-differential amplifier circuits 11a, 13a, Vo− is an output voltage of a second output terminal (−) of each of the full-differential amplifier circuits 11a, 13a, and third differential voltage ΔVo+ and a fourth differential voltage ΔVo− are differential voltages of these output voltages Vo+, Vo− and the reference voltage Vref, respectively. Simultaneous equations are solved in consideration of the relations of these and Formula (16), to allow expression as in Formula (19).

$$Vo+ = Vref + \Delta Vo+ \tag{17}$$

$$Vo- = Vref - \Delta Vo- \tag{18}$$

$$(\Delta Vo- / \Delta Vo+) = (R14/R13) \tag{19}$$

The third differential voltage ΔVo+ in Formula (17) corresponds to the first differential voltage described in the first embodiment, for example, and the fourth differential voltage ΔVo− in Formula (18) corresponds to the second differential voltage described in the first embodiment. Hence the next formula holds in the first embodiment.

$$(\Delta Vo- / \Delta Vo+) = (A2 \cdot \Delta V)/(A1 \cdot \Delta V) = (A2/A1) = r \tag{20}$$

It is thereby found that Formula (19) is a formula obtained by replacing (A2/A1) in Formula (20) with (R14/R13). Further, (A2/A1) in Formula (20) is equivalent to the ratio r of the amplification factors in Formula (5). Accordingly, Formula (21) below holds, and the relations of FIGS. 9A to 9C and FIG. 10 can be applied.

$$(R14/R13) = r \tag{21}$$

That is, in the present embodiment, it is possible to obtain a similar function effect to that of the first embodiment, for example. Consequently, in the signal ratio change circuit 132, the circuit for outputting a voltage to the system A and the system B can be configured of the full-differential amplifier circuit 11a and the resistor 15a, and similarly, the circuit for outputting a voltage to the system C and the system D can be configured of the full-differential amplifier circuit 13a and the resistor 17a.

In the configuration of the present embodiment, the two output terminals (non-inverted output terminal, inverted output terminal) of each of the full-differential amplifier circuits 11a, 13a can be effectively utilized, while a similar effect to that of the first embodiment is exerted, thus reducing a circuit configuration area as much as possible.

Other Embodiments

The present disclosure is not restricted to each of the embodiments described above and in the drawings, but can be modified or expanded as follows.

Although the configurations of the variety of signal ratio change circuits have been described in the above embodiments, these are not restrictive. When the signal ratio change circuit is configured so as to be able to set the ratio of the absolute values of the first differential voltage and the second differential voltage to other than "1", it is possible to obtain a similar effect to the foregoing effect.

Although the foregoing pulse circulation circuit (ring delay line) has been configured by placing the NAND gate and an odd number of inverters in a row from the viewpoint of reliable oscillation, the pulse circulation circuit may be configured using an even number of inverters having achieved reliable oscillating operation (those described in JP-2010-148005-A, etc.), or the like. With the use of the even number of inverters, the pulse circulation position and encoded data correspond one to one, thus leading to improvement in linearity in the low-order bits. Further, although the detection of the pulse circulation position and the like are performed by output of all the inverters, a reduced number of inverters, such as every other inverter, may be used.

Although the examples of the up/down counter and the overlapping detection section have been shown in FIG. 5, the circuit configuration is not restricted to that of FIG. 5. Although the pulse generation section 48 is provided in the configuration of FIG. 5, the pulse generation section 48 may not be provided. When the pulse generation section 48 is not provided, it corresponds to replacement of the pulse signals SB' and SA' in FIG. 6 with the pulse signals SB and SA, respectively. That is, it corresponds to that cycles of the pulse signals SB' and the pulse signal SA' are doubled, and hence such a configuration can be employed when there is plenty of A/D conversion time.

Although the inverters are used in several places for generating a delay time in the above embodiments, such use can be changed in accordance with a required delay time by focusing attention on which of an odd number or an even number a successive number of inverters is. Further, as the delay element for generating a delay time, a capacitor other than an inverter, wiring in a chip, or a parasitic capacitance of the element may be utilized.

In the embodiment of the present application, by setting all bits 0 as a preset value of the up/down counter of the first kind such as the first counter 42 shown in FIG. 1 and the like, the A/D conversion value in the reference voltage Vref has been set to all bits 0. In contrast, when an arbitrary value is preset, it can be added to the A/D conversion value. In application to the sensor or the like, it can be used for offset correction.

Also in each of the embodiments provided with the latch/encoders 37, 39 (first and second circulation position detection circuits 5, 6), the latch/encoders 37, 39 can be omitted.

Also in each of the embodiments except for the fourth embodiment, the counters 84, 85 may be provided in place of the first counter 42, as shown in the fourth embodiment.

Although the comparator 44 has detected the output value of the second counter 43 having reached all bits 0, the comparator 44 may detect the output value having reached all bits 1. In this case, such a configuration is formed where a difference between the value of all bits 1 and the prescribed value Y is preset as a high-order preset value to the second counter 43, and the conversion data output processing signal Sa is outputted when a differential value outputted by the second counter 43 reaches all bits 1.

The bypass capacitors Cp may be provided according to the need.

The configuration for offsetting the temperature characteristic (performing temperature compensation), mainly formed of the third and fourth pulse circulation circuits 33, 34, the second counter 43 and the like is not necessarily provided. The same applies to a variety of devises for performing the temperature compensation. In that case, the conversion control circuit 4 may be configured to output the conversion data output processing signal Sa at arbitrary timing.

Although the pressure sensor, the current sensor and the magnetic sensor have been cited in the application to the sensor product, it goes without saying that the application is possible to other sensors such as a temperature sensor.

Further, the present disclosure can be mounted not in the sensor but as a peripheral circuit of a digital signal processing device such as a microprocessor (microcontroller) or a DSP (Digital Signal Processor).

The present disclosure includes the following aspects.

In a first aspect of the present disclosure, an A/D conversion circuit for outputting A/D conversion data in accordance with a difference between an analog input voltage and a reference voltage, the A/D conversion circuit includes: a first pulse circulation circuit and a second pulse circulation circuit, each of which is provided by a plurality of delay units for delaying an input signal by a delay time that is determined in accordance with a power source voltage and for outputting a delayed input signal, and circulates a pulse signal through the delay units, the delay units being connected to each other in a ring shape; a circulation number difference measurement section that counts the number of circulation times of the pulse signal through the first pulse circulation circuit and the number of circulation times of the pulse signal through the second pulse circulation circuit, and outputs a differential value between counted numbers; a conversion control circuit that outputs a conversion data output processing signal for determining a timing to complete A/D conversion, and outputs the differential value outputted by the circulation number difference measurement section as A/D conversion data with respect to the analog input voltage; and a signal ratio change circuit that: sets a voltage, obtained by subtracting the reference voltage from the analog input voltage, as a differential voltage; outputs, from a first output terminal, a voltage calculated by adding the reference voltage and a first differential voltage obtained by multiplying the differential voltage by a first proportional coefficient; and outputs, from a second output terminal, a voltage calculated by subtracting, from the reference voltage, a second differential voltage obtained by multiplying the differential voltage by a second proportional coefficient having a same sign as the first proportional coefficient. Each delay unit of the first pulse circulation circuit receives a power source voltage supplied from the first output terminal of the signal ratio change circuit and a ground line. Each delay unit of the second pulse circulation circuit receives a power source voltage supplied from the second output terminal of the signal ratio change circuit and the ground line.

As thus described, the above A/D conversion circuit is configured in a similar manner to the foregoing configuration of the prior art with regard to the portion except for the signal ratio change circuit. Hence it is possible to obtain almost an equivalent effect to that of the configuration of the prior art, namely the effect of offsetting the nonlinearity of the TAD. In this case, however, due to the provision of the signal ratio change circuit, applied voltages to the delay units of the first and second pulse circulation circuits have mutually inversed increasing/decreasing polarities and have different absolute values. For this reason, in the configuration of the present means, only part of the nonlinearity of the TAD is offset.

The balance of the absolute values of the applied voltages to the delay units of the first and second pulse circulation circuits can be arbitrarily set by two proportional coefficients in the signal ratio change circuit, namely a first proportional coefficient and a second proportional coefficient. That is, the present means is configured so as to be able to arbitrarily change the nonlinearity of the TAD.

With such a configuration, when a sensor or the like which outputs an analog input voltage has the nonlinearity, by setting the nonlinearity of the TAD to a value with a positive/negative polarity inverted to that of the nonlinearity of the sensor, it is possible to offset the nonlinearity of the sensor. Thus, according to the present means, even when the sensor or the like which outputs an analog input voltage has the nonlinearity, it is not necessary to perform digital operation for correcting the nonlinearity included in A/D conversion data. As a result, fast responsiveness as the sensor device can be achieved.

With the above configuration, when an absolute value of the first differential voltage is set smaller than an absolute value of the second differential voltage, namely when the first proportional coefficient is set to a smaller value than the second proportional coefficient, the concave nonlinearity can be achieved.

Further, with the above configuration, when an absolute value of the first differential voltage is set larger than an absolute value of the second differential voltage, namely when the first proportional coefficient is set to a larger value than the second proportional coefficient, the convex nonlinearity can be achieved.

Alternatively, the analog input voltage may be outputted from a sensor having a convex nonlinear characteristic in a range, in which a voltage of the first output terminal is higher than the reference voltage. An absolute value of the first differential voltage is set smaller than an absolute value of the second differential voltage. When the absolute value of the first differential voltage is set smaller than the absolute value of the second differential voltage, namely when the first proportional coefficient is set to a smaller value than the second proportional coefficient, the concave nonlinearity can be achieved. Thus, it is possible to offset the nonlinearity of the sensor in a good manner.

Alternatively, the analog input voltage may be outputted from a sensor having a concave nonlinear characteristic in a range, in which a voltage of the first output terminal is higher than the reference voltage. An absolute value of the first differential voltage is set larger than an absolute value of the second differential voltage. With the above configuration, when the absolute value of the first differential voltage is set larger than the absolute value of the second differential voltage, namely when the first proportional coefficient is set to a larger value than the second proportional coefficient, the convex nonlinearity can be achieved. Thus, it is possible to offset the nonlinearity of the sensor in a good manner.

Alternatively, the signal ratio change circuit may include: a first amplifying circuit that has the first output terminal and outputs from the first output terminal the voltage calculated by adding the reference voltage and the first differential voltage obtained by multiplying the differential voltage by the first proportional coefficient; and a second amplifying circuit that has the second output terminal and outputs from the second output terminal the voltage calculated by subtracting, from the reference voltage, the second differential voltage obtained by multiplying the differential voltage by the second proportional coefficient having the same sign as the first proportional coefficient. In this case, the first proportional coefficient and the second proportional coefficient can be easily changed.

Alternatively, the signal ratio change circuit may include a full-differential amplifier circuit that has the first output terminal and the second output terminal, and respectively outputs, from the first output terminal and the second output terminal, a voltage satisfying a condition that a ratio between a third differential voltage and a fourth differential voltage is equal to a ratio between the first proportional coefficient and the second proportional coefficient. A difference between an output voltage of the first output terminal and the reference voltage is defined as the third differential voltage. A difference between an output voltage of the second output terminal and the reference voltage is defined as the fourth differential voltage. In this case, the circuit configuration area can be reduced as much as possible.

Alternatively, the signal ratio change circuit may include a signal ratio adjusting means that adjusts the first proportional coefficient and the second proportional coefficient. Here, in a case where a sensor product is configured by combination of the A/D conversion circuit and a sensor element, even when there is variation in nonlinearity of the sensor element, the nonlinearity can be offset in accordance with the variation. Further, in this case, the nonlinearity can be changed even after the A/D conversion circuit is combined with the sensor element. Thus, even when the characteristic concerning the nonlinearity of the sensor element to be combined is unclear, or even when a variety of kinds of sensor elements may be combined, the nonlinearity of the combined sensor element can be reliably offset.

Alternatively, the A/D conversion circuit may further include: a first circulation position detection circuit and a second circulation position detection circuit that respectively detect pulse positions in the first pulse circulation circuit and the second pulse circulation circuit when the conversion control circuit outputs the conversion data output processing signal. When the conversion control circuit outputs the conversion data output processing signal, the conversion control circuit associates a difference between a pulse position in the first pulse circulation circuit and a pulse position in the second pulse circulation circuit with a predetermined number of bits, sets obtained data as low-order data of the A/D conversion data, sets a sum of a differential value outputted by the circulation number difference measurement section and a carry from the low-order data, or a sum of the differential value and a borrow from the low-order data, as high-order data of the A/D conversion data. The carry is a positive value. The borrow is a negative value. In this case, the resolution of the A/D conversion data can be enhanced.

Alternatively, the circulation number difference measurement section may perform count-up and count-down every time the pulse signals are outputted from the delay units disposed in a same position in the first pulse circulation circuit and the second pulse circulation circuit, respectively. In this case, the differential value of the numbers of circulation can be obtained by use of the up/down counter in the circulation number difference measurement section.

Alternatively, the circulation number difference measurement section may include one of a first type up-down counter and a second type up-down counter. The first type up-down counter: includes a count stop terminal, a count-up input terminal, and a count-down input terminal; performs count-up or count-down in accordance with which of the count-up input terminal or the count-down input terminal a pulse signal is inputted into; and stops a count operation in accordance with the conversion data output processing signal being inputted into the count stop terminal. The second type up-down counter: includes two sets of a counter for obtaining a count-up value and a count-down value and a latch for keeping a counted value in accordance with the conversion data output processing signal being inputted; and outputs a difference between the counted values kept in the two latches. In this case, when the up/down counter of the first kind is employed, the operation circuit is not required. When the up/down counter of the second kind is employed, a general-purpose counter can be used.

Alternatively, the first type up-down counter may further include: an input section that generates a count signal and a mode signal for directing count-up and count-down in accordance with an inputted pulse signal; and a counter section that performs count-up or count-down in accordance with the count signal and the mode signal. The input section includes an overlapping detection section and a count signal output section. The overlapping detection section: monitors occurrence or non-occurrence of an overlapping state where pulse signals are simultaneously inputted into the count-up input terminal and the count-down input terminal; outputs an overlapping detection signal when the occurrence of the overlapping state is detected; and stop outputting the overlapping detection signal at least after a delay time between an input and an output in the count signal output section lapses from completion of overlapped two pulse signals. The count signal output section outputs a count signal to the counter section in accordance with completion of the pulse signal inputted into the count-up input terminal or the count-down input terminal when the overlapping detection signal is not inputted from the overlapping detection section. The count signal output section does not output the count signal to the counter section when the overlapping detection signal is inputted. Normally, in the counter operation, a change is made from the least significant bit and then carry information or borrow information is sequentially propagated. That is, propagation delay is generated in the counter during the count operation. As in the way of using the up/down counter of the present claim, when the count-up signal and the count-down signal are alternately inputted in an asynchronous manner, the next count operation is started before the last count operation is completed, which can cause erroneous operation. Thus, the coordinated operation of the overlapping detection section and the count signal output section as described above is required. When the pulse signals outputted from the first and second pulse circulation circuits overlap, the differential value of the numbers of circulation in the up/down counter remains unchanged as a result. With the configuration of the present means provided, the count signal to the counter section is stopped when the overlapping state is detected. Hence the counted value can be kept unchanged without practically performing count-up or count-down, thus preventing occurrence of erroneous counting.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An A/D conversion circuit for outputting A/D conversion data in accordance with a difference between an analog input voltage and a reference voltage, the A/D conversion circuit comprising:
   a first pulse circulation circuit and a second pulse circulation circuit, each of which is provided by a plurality of delay units for delaying an input signal by a delay time that is determined in accordance with a power source voltage and for outputting a delayed input signal, and circulates a pulse signal through the delay units, the delay units being connected to each other in a ring shape;
   a circulation number difference measurement section that counts the number of circulation times of the pulse signal through the first pulse circulation circuit and the number of circulation times of the pulse signal through the second pulse circulation circuit, and outputs a differential value between counted numbers;
   a conversion control circuit that outputs a conversion data output processing signal for determining a timing to complete A/D conversion, and outputs the differential value outputted by the circulation number difference measurement section as A/D conversion data with respect to the analog input voltage; and
   a signal ratio change circuit that:
      sets a voltage, obtained by subtracting the reference voltage from the analog input voltage, as a differential voltage;
      outputs, from a first output terminal, a voltage calculated by adding the reference voltage and a first differential voltage obtained by multiplying the differential voltage by a first proportional coefficient; and
      outputs, from a second output terminal, a voltage calculated by subtracting, from the reference voltage, a second differential voltage obtained by multiplying the differential voltage by a second proportional coefficient having a same sign as the first proportional coefficient, wherein:
   each delay unit of the first pulse circulation circuit receives a power source voltage supplied from the first output terminal of the signal ratio change circuit and a ground line; and
   each delay unit of the second pulse circulation circuit receives a power source voltage supplied from the second output terminal of the signal ratio change circuit and the ground line.

2. The A/D conversion circuit according to claim 1, wherein:
   the analog input voltage is outputted from a sensor having a convex nonlinear characteristic in a range, in which a voltage of the first output terminal is higher than the reference voltage; and
   an absolute value of the first differential voltage is set smaller than an absolute value of the second differential voltage.

3. The A/D conversion circuit according to claim 1, wherein:
   the analog input voltage is outputted from a sensor having a concave nonlinear characteristic in a range, in which a voltage of the first output terminal is higher than the reference voltage; and
   an absolute value of the first differential voltage is set larger than an absolute value of the second differential voltage.

4. The A/D conversion circuit according to claim 1, wherein
   the signal ratio change circuit includes:
      a first amplifying circuit that has the first output terminal and outputs from the first output terminal the voltage calculated by adding the reference voltage and the first differential voltage obtained by multiplying the differential voltage by the first proportional coefficient; and
      a second amplifying circuit that has the second output terminal and outputs from the second output terminal the voltage calculated by subtracting, from the reference voltage, the second differential voltage obtained by multiplying the differential voltage by the second proportional coefficient having the same sign as the first proportional coefficient.

5. The A/D conversion circuit according to claim 1, wherein:
   the signal ratio change circuit includes a full-differential amplifier circuit that has the first output terminal and the second output terminal, and respectively outputs, from the first output terminal and the second output terminal, a voltage satisfying a condition that a ratio between a third differential voltage and a fourth differential voltage is equal to a ratio between the first proportional coefficient and the second proportional coefficient;
   a difference between an output voltage of the first output terminal and the reference voltage is defined as the third differential voltage; and
   a difference between an output voltage of the second output terminal and the reference voltage is defined as the fourth differential voltage.

6. The A/D conversion circuit according to claim 1, wherein:
the signal ratio change circuit includes a signal ratio adjusting means that adjusts the first proportional coefficient and the second proportional coefficient.

7. The A/D conversion circuit according to claim 1, further comprising:
a first circulation position detection circuit and a second circulation position detection circuit that respectively detect pulse positions in the first pulse circulation circuit and the second pulse circulation circuit when the conversion control circuit outputs the conversion data output processing signal, wherein:
when the conversion control circuit outputs the conversion data output processing signal, the conversion control circuit associates a difference between a pulse position in the first pulse circulation circuit and a pulse position in the second pulse circulation circuit with a predetermined number of bits, sets obtained data as low-order data of the A/D conversion data, sets a sum of a differential value outputted by the circulation number difference measurement section and a carry from the low-order data, or a sum of the differential value and a borrow from the low-order data, as high-order data of the A/D conversion data; and
the carry is a positive value; and
the borrow is a negative value.

8. The A/D conversion circuit according to claim 1, wherein:
the circulation number difference measurement section performs count-up and count-down every time the pulse signals are outputted from the delay units disposed in a same position in the first pulse circulation circuit and the second pulse circulation circuit, respectively.

9. The A/D conversion circuit according to claim 8, wherein:
the circulation number difference measurement section includes one of a first type up-down counter and a second type up-down counter;
the first type up-down counter:
includes a count stop terminal, a count-up input terminal, and a count-down input terminal;
performs count-up or count-down in accordance with which of the count-up input terminal or the count-down input terminal a pulse signal is inputted into; and
stops a count operation in accordance with the conversion data output processing signal being inputted into the count stop terminal; and the second type up-down counter:
includes two sets of a counter for obtaining a count-up value and a count-down value and a latch for keeping a counted value in accordance with the conversion data output processing signal being inputted; and
outputs a difference between the counted values kept in the two latches.

10. The A/D conversion circuit according to claim 9, wherein:
the first type up-down counter further includes:
an input section that generates a count signal and a mode signal for directing count-up and count-down in accordance with an inputted pulse signal; and
a counter section that performs count-up or count-down in accordance with the count signal and the mode signal;
the input section includes an overlapping detection section and a count signal output section;
the overlapping detection section:
monitors occurrence or non-occurrence of an overlapping state where pulse signals are simultaneously inputted into the count-up input terminal and the count-down input terminal;
outputs an overlapping detection signal when the occurrence of the overlapping state is detected; and
stop outputting the overlapping detection signal at least after a delay time between an input and an output in the count signal output section lapses from completion of overlapped two pulse signals;
the count signal output section outputs a count signal to the counter section in accordance with completion of the pulse signal inputted into the count-up input terminal or the count-down input terminal when the overlapping detection signal is not inputted from the overlapping detection section; and
the count signal output section does not output the count signal to the counter section when the overlapping detection signal is inputted.

11. The A/D conversion circuit according to claim 1, wherein:
the analog input voltage is outputted from a piezo-resistance effect pressure sensor.

12. The A/D conversion circuit according to claim 1, wherein:
the analog input voltage is outputted from a sensor having an MRE or a GMR as a magnetic sensing element.

* * * * *